US007243285B2

(12) United States Patent
Foisy et al.

(10) Patent No.: US 7,243,285 B2
(45) Date of Patent: *Jul. 10, 2007

(54) SYSTEMS AND METHODS FOR BROADCASTING INFORMATION ADDITIVE CODES

(75) Inventors: Christian Foisy, Saint-Lazare (CA); Joseph A. Vo, San Francisco, CA (US); M. Amin Shokrollahi, San Jose, CA (US); Michael G. Luby, Berkeley, CA (US)

(73) Assignee: Digital Fountain, Inc., Fremont, CA (US)

( * ) Notice: Subject to any disclaimer, the term of this patent is extended or adjusted under 35 U.S.C. 154(b) by 81 days.

This patent is subject to a terminal disclaimer.

(21) Appl. No.: 10/618,455

(22) Filed: Jul. 10, 2003

(65) Prior Publication Data

US 2004/0101274 A1 May 27, 2004

Related U.S. Application Data

(63) Continuation-in-part of application No. 10/076,623, filed on Feb. 14, 2002, now Pat. No. 6,614,366, and a continuation-in-part of application No. 10/032,156, filed on Dec. 21, 2001, which is a continuation of application No. 09/757,078, filed on Jan. 8, 2001, now Pat. No. 6,373,406, which is a continuation of application No. 09/246,015, filed on Feb. 5, 1999, now Pat. No. 6,307,487.

(60) Provisional application No. 60/101,473, filed on Sep. 23, 1999.

(51) Int. Cl.
*H03M 13/05* (2006.01)
*H04L 1/02* (2006.01)

(52) U.S. Cl. .................................................... 714/752
(58) Field of Classification Search ................ 714/752, 714/776
See application file for complete search history.

(56) References Cited

U.S. PATENT DOCUMENTS 5,425,050 A * 6/1995 Schreiber et al. ........... 375/141
5,617,541 A * 4/1997 Albanese et al. ........... 709/207
5,870,412 A * 2/1999 Schuster et al. ............ 714/752

(Continued)

FOREIGN PATENT DOCUMENTS

WO    WO 96/34463 A1    10/1996

(Continued)

OTHER PUBLICATIONS

Naguib, Ayman, et al., "Applications of Space-Time Block Codes and Interference Suppression for High Capacity and High Data Rate Wireless Systems," IEEE, 1998, pp. 1803-1810.

*Primary Examiner*—Stephen M. Baker
(74) *Attorney, Agent, or Firm*—Philip H. Albert; Townsend and Townsend and Crew

(57) ABSTRACT

A broadcasting system for communicating data to multiple receivers using information additive code includes one or more information additive code transmitters and one or more information additive code receivers. Each of the information additive code transmitters includes an encoder configured to receive source data and to produce information additive code therefrom. Each of the information additive code receivers includes a decoder configured to receive the information additive code and to reconstruct therefrom substantially a copy of the source data.

62 Claims, 16 Drawing Sheets

U.S. PATENT DOCUMENTS

| | | | |
|---|---|---|---|
| 5,917,852 A * | 6/1999 | Butterfield et al. | 375/141 |
| 6,012,159 A * | 1/2000 | Fischer et al. | 714/755 |
| 6,081,907 A * | 6/2000 | Witty et al. | 714/6 |
| 6,141,788 A * | 10/2000 | Rosenberg et al. | 714/774 |
| 6,175,944 B1 * | 1/2001 | Urbanke et al. | 714/776 |
| 6,243,846 B1 * | 6/2001 | Schuster et al. | 714/776 |
| 6,278,716 B1 * | 8/2001 | Rubenstein et al. | 370/432 |
| 6,307,487 B1 * | 10/2001 | Luby | 341/50 |
| 6,373,406 B2 | 4/2002 | Luby | |
| 6,421,387 B1 * | 7/2002 | Rhee | 375/240.27 |
| 6,445,717 B1 * | 9/2002 | Gibson et al. | 370/473 |
| 6,677,864 B2 * | 1/2004 | Khayrallah | 341/50 |
| 2003/0058958 A1 * | 3/2003 | Shokrollahi et al. | 375/295 |
| 2003/0226089 A1 * | 12/2003 | Rasmussen et al. | 714/758 |
| 2004/0075592 A1 * | 4/2004 | Shokrollahi et al. | 341/50 |

FOREIGN PATENT DOCUMENTS

WO     WO 00/14921 A1     3/2000

\* cited by examiner

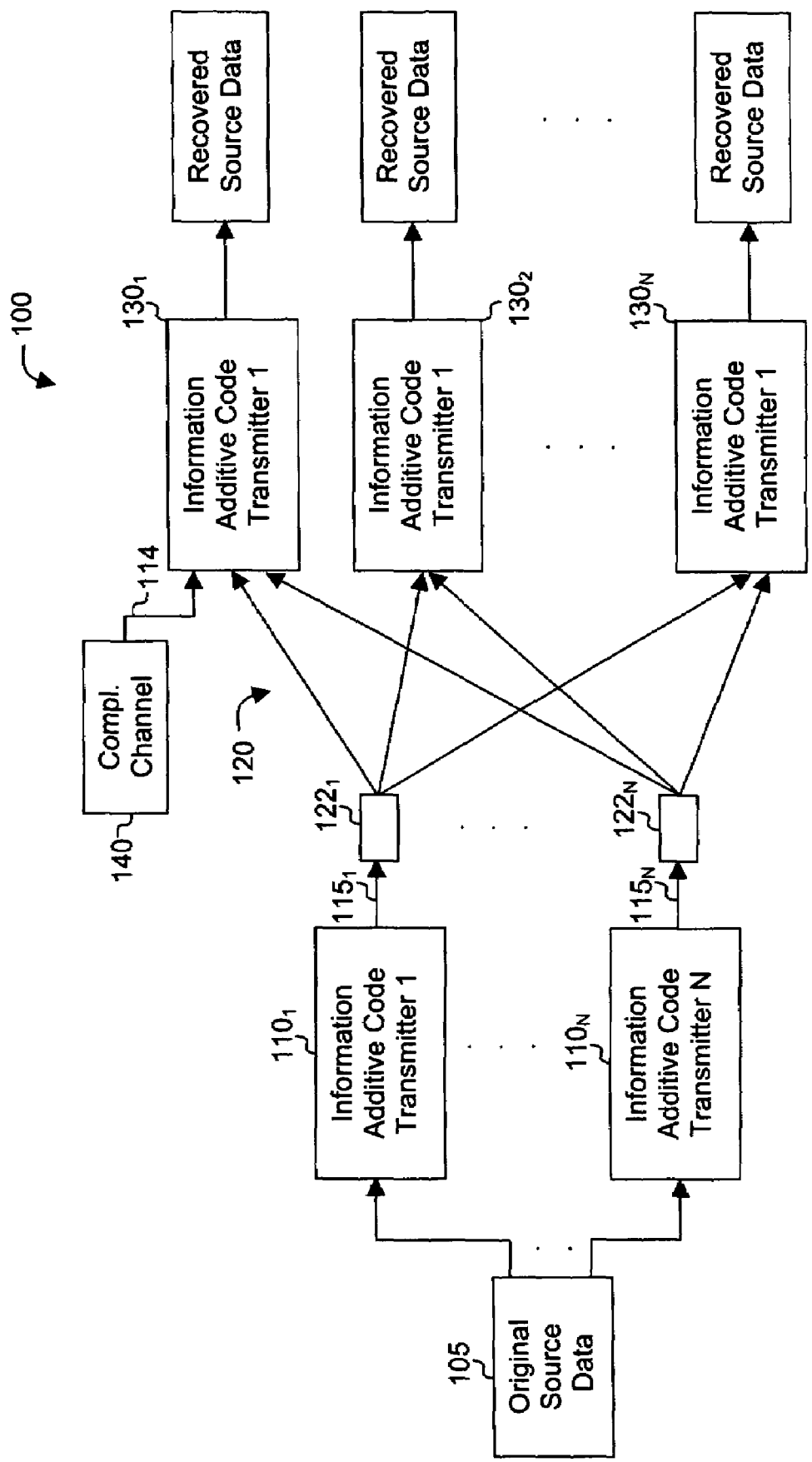

SYSTEMS AND METHODS FOR BROADCASTING INFORMATION ADDITIVE CODES

CROSS REFERENCE TO RELATED APPLICATIONS

The following references are herein incorporated in their entirety for all purposes:

a) Commonly assigned U.S. Pat. No. 6,373,406, entitled "Information Additive Code Generator and Decoder for Communication Systems" (hereinafter "Luby I");

b) Commonly assigned U.S. patent application Ser. No. 09/768,843, filed Jan. 23, 2001, entitled "Methods and Apparatus for Scheduling, Serving, Receiving Media-on-Demand For Clients, Servers Arranged According to Constraints and Resources" (hereinafter "MOD");

c) Commonly assigned U.S. patent application Ser. No. 10/032,156, filed Dec. 21, 2001, entitled "Multi-stage Code Generator and Decoder for Communication Systems" (hereinafter "Raptor");

d) Commonly assigned U.S. patent application Ser. No. 10/367,573, filed Feb. 14, 2003, entitled "Systems and Methods for Reliably Communicating the Content of a Live Data Stream" (hereinafter "Rasmussen"); and e) Commonly assigned U.S. patent application Ser. No. 10/459,370, filed Jun. 10, 2003, entitled "Systems and Processes for Decoding Chain Reaction Codes Through Inactivation" (hereinafter "Shokrollahi").

BACKGROUND OF THE INVENTION

The present invention relates generally to systems and methods for broadcasting information, and more particularly to systems and methods for broadcasting information, data or content, to intermittently available receivers, such as mobile receivers.

A conventional approach to broadcasting data to a large number of receivers is referred to as the "data carousel" protocol. Using this approach, broadcast data is usually split into equal-sized packets, each of which forms a section in a data carousel. Each section is then broadcast over a specific period of time, and the data carousel continues to repeat to transmit those data portions that one or more receivers did not receive. Usually the broadcasting terminal (e.g., a network server, satellite or terrestrial transmitter) will need to transmit the data in the repeated fashion many times since it is usually not possible to synchronize the receivers to receive the transmitted data during one transmission period. The continued transmission of the same data set reduces the transmitter's efficiency, and as the transmission cycles continue, successively fewer receivers benefit from the transmission.

Further complicating this approach is the observation that in many applications, each receiver, through its normal course of operation, may itself be switched on and off during a transmission period. Systems such as automotive-based data receivers (e.g., on-board navigation systems), global positioning systems, cellular handsets, and portable computers employing 802.11x wireless communication protocols are but a few examples of such receivers. The sheer number of these receivers combined with their intermittent operation greatly increases the number of transmission cycles required to ensure that a large majority of the receivers have received all data segments.

Forward error/erasure correction (FEC) represents a conventional improvement to the data carousel approach. In this approach, a forward error correction algorithm is applied to each of the data segments, producing redundant data for that segment. This approach is an improvement over the data carousel, as the receiver needs only receive a subset of each data segment to correctly decode it. This results in fewer transmission cycles being needed to disseminate the broadcast data to a large majority of receivers. While providing an improvement, the FEC data carousel systems still has the disadvantages that: (1) each receiver must still receive a relatively large portion of each data segment; and (2) prior art FEC codes used in such data carousel systems, such as Reed-Solomon codes, require computational resources well beyond that which is available or commercially feasible in many applications. As noted above, many of the intermittently available receivers will not remain continuously on during a transmission period, and accordingly, a large number of repeated transmission cycles will be needed. It is expected that in practice some receivers will receive all segments quickly, while others will take a long time, resulting in the aforementioned condition of repeatedly broadcasting previous data over a long period to achieve a high rate of successful receptions.

What is therefore needed are systems and methods for broadcasting data to receivers, including mobile and intermittently available receivers, in a more efficient manner.

BRIEF SUMMARY OF THE INVENTION

The present invention describes new systems and methods for broadcasting data to all types of receivers, including those intermittently available such as mobile receivers, in a highly efficient manner using information additive coding. Information additive coded information (herein referred to as "information additive codes," exemplary embodiments of which include "LT Codes," "Raptor Codes," and "Chain Reaction Codes" described in the assignee's references incorporated herein) exhibits the unique property that any coded segment can be used to recover the original source data. Accordingly, a receiver system using such information additive codes need only receive some threshold amount of the coded data, regardless of what particular segment it contains, or when it is received. The receiver system also does not rely on a backchannel to ensure reception of all transmitted data. These properties make the present invention useful for broadcasting systems, and particularly advantageous for systems broadcasting to intermittently available receivers, as data can be recovered efficiently at all times during reception periods.

In a particular embodiment of the invention, a broadcasting system is described having one or more information additive code transmitters and one or more information additive code receivers. Each of the information additive code transmitters includes an encoder configured to receive source data and to produce information additive code therefrom. Each of the information additive code receivers includes a decoder configured to receive the information additive code and to reconstruct therefrom substantially a copy of the source data.

This and other systems and methods of the present invention are provided below, a better understanding of which can be obtained with reference to the following figures and description.

BRIEF DESCRIPTION OF THE DRAWINGS

FIGS. 1A and 1B illustrate a system and corresponding method for broadcasting information additive codes in accordance with the present invention.

Figure 1B:
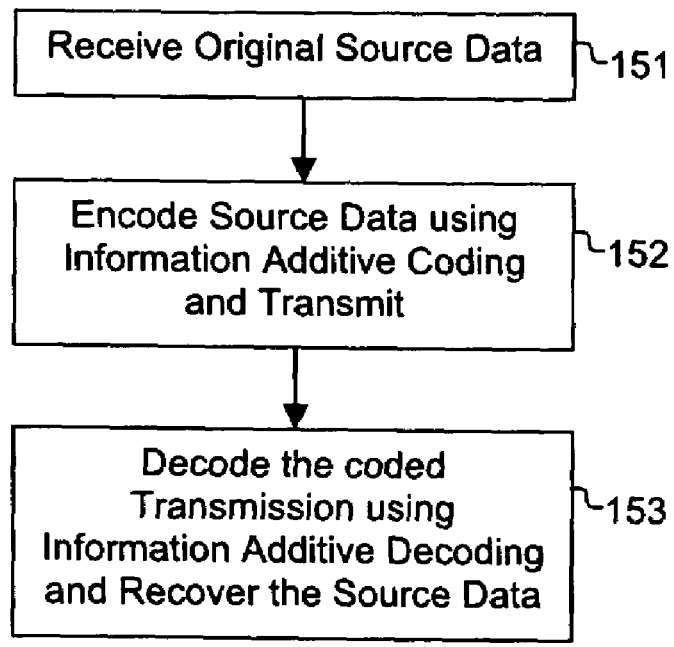

For clarity and convenience, features and components which are identified in earlier drawings retain their reference numerals in subsequent drawings.

DETAILED DESCRIPTION OF SPECIFIC EMBODIMENTS

The broadcasting system and methods of present invention can be used in a variety of applications, particularly in mobile systems in which the receiver may be switched on and off during its normal course of operation. For example, the system may be used to update map databases in automotive-based receivers periodically without the driver's knowledge or intervention. In other applications, the broadcasting system may be used to send passenger manifests to train conductors while the train is in motion, updating and broadcasting weather information to receivers installed on boats and planes, or sending information to PDAs, cell phones, and the like. Other applications of the present invention are further described below with reference to FIGS. 9A and 9B.

System Overview

FIGS. 1A and 1B illustrate a general block diagram of system and corresponding method for broadcasting information additive codes in accordance with the present invention. In a particular embodiment described below, the system is configured to broadcast information additive codes to a number of mobile terminals, for example a number of automobiles.

Referring first to FIG. 1A, the exemplary broadcast system 100 includes one or more information additive code transmitters (transmitters) $110_{1-N}$, each of which sends a coded transmission $115_{1-N}$ across a primary channel 120 to one or more information additive code receivers (receivers) $130_{1-N}$. The coded transmission 115 comprises the information additive codes which are modulated or multiplexed in the appropriate manner to facilitate transmission to the receivers $130_{1-N}$. In those embodiments in which no multiplexing or modulation is needed for broadcast transmission, the term coded transmission will refer to the information additive codes themselves. The information additive codes are comprised of output symbols, the generation of which is further described below.

In a particular embodiment as shown, the source data 105 is supplied to two or more transmitters $110_{1-N}$. This embodiment can be employed to provide redundancy over the primary channel 120, or to increase the effective reception rate of the receivers 130, as the information additive receivers are capable of decoding the coded transmission upon receiving any suitable number of coded blocks, without regard to the particular data block received. In an alternative embodiment, different source data is supplied to different transmitters. In this instance, different transmitters can be used to simultaneously transmit different content, among which the receiver can selectively choose. In a third embodiment, the source data 105 comprises diverse data multiplexed onto a single stream supplied to the transmitters $110_{1-N}$. As in the previous embodiment, this arrangement provides the ability to concurrently broadcast several different programs to the receivers $130_{1-N}$ from which a receiver can selectively choose.

One or more of the receivers (receiver $130_1$ as shown) are configured to receive the coded transmission 114 via a secondary channel 140. The secondary channel 140 provides an alternate communication route should reception via the primary channel not be possible. The secondary channel 140 preferably comprises a channel complimentary to that of the primary channel, for example, a telephone or cable modem line or terrestrial link in the instance in which the primary channel 120 is a satellite link. In a particular embodiment, the secondary channel 140 provides additive information codes data which have not been sent over the primary channel 120. To achieve this, either the secondary channel 140 has its own dedicated additive information codes transmitter, or some encoded data is diverted from primary channel 120.

The transmission channel (primary 120 or secondary 140) may comprise any of several communication architectures suitable for the particular multicast or broadcast application. For example, the transmission channel may comprise an internal bus architecture operable to communicate data within a microprocessor or computer system. In another embodiment, the channel comprises an external computer network, such as a local area network, a medium area network, wide area network, or the Internet, in which one source (e.g., a server) broadcasts data to one or more computers. In a third embodiment, the transmission channel comprises a telephone line (analog or digital), cable (electronic or fiber optic), or other structure which can guide and support the propagation of a data signal. In a fourth embodiment, the channel comprises a free space (RF/electromagnetic or optical wavelength) terrestrial or space-based communications link. The mode of communication employed, e.g., electrical or optical, format of modulation, transmission via a guided structure or free space, is a design choice, and any means for communicating information from one or more transmitters to one or more receivers may be used as a transmission channel in the present invention. Further, a recording/storage device $122_N$ (e.g., tape drive, hard disk drive, memory, etc.) may be used to record/store the coded transmissions $115_N$ broadcast from each transmitter $130_N$. The recording/storage devices 122 may be used to provide playback of earlier transmitted data when requested.

Referring now to FIG. 1B, the operation of the system 100 begins at 151 when the original source data 105 is supplied to one or more of the transmitters 110. The source data 105 can be in any form or structure, e.g., a data stream, a data file, etc., and may comprise a multiplexed stream of diverse data. The source data 105 may be supplied in a segmented size which is more optimally processed, or the segmentation process may occur within the transmitter and/or receiver structures as described below.

Subsequently at 152, the supplied source data is encoded into information additive codes, modulated onto a carrier signal (when needed), and transmitted via the primary or secondary channels 120 or 140. In one embodiment, the source data 105 is encoded using a single-stage information additive code generator described in Luby I. In another embodiment, the source data is encoded using a multistage information additive code generator as described in Raptor. Exemplary embodiments of such encoding systems and processes are further described below.

As shown and described above, the coded transmission 115 may be sent via two or more transmitters $110_{1-N}$ in order to provide redundancy, an increased reception rate, or multiple data programs. Alternatively, the coded transmission 115 may be made available to one or more receivers via a secondary channel 140 to provide redundancy. As a further alternative, the second channel 140 may carry a different coded transmission, such as a different source data or session information, further described below.

The format and size of the coded transmission 115 will vary depending upon the particular data application, transmission channel, and receiver requirements. Possible formats include UDP packets, MPEG data streams, ATM cell streams, serial byte streams, file(s) in a shared storage medium, FDDI data streams or SCSI command and data streams, satellite transmissions, cellular phone transmissions, PCS transmissions, GSM transmissions, HDTV transmissions, or similarly formatted transport. Preferably, the coded transmission is composed of atomic medium blocks (AMBs) which are native to, or optimally processed by the transmission channel and/or the receivers 130.

At 153, the coded transmission 115 is received by one or more of the receivers 130, each receiver 130 configured to recover a copy of the source data 105 therefrom. In one embodiment, the coded transmission 115 is decoded using a single-stage information additive code decoded as described in Luby I. In another embodiment, the coded transmission is decoded using a multistage information additive code decoder as described in Raptor. Exemplary embodiments of such decoding systems and processes are further described below.

Exemplary Broadcast Transmitters and Processes

Figure 2B:
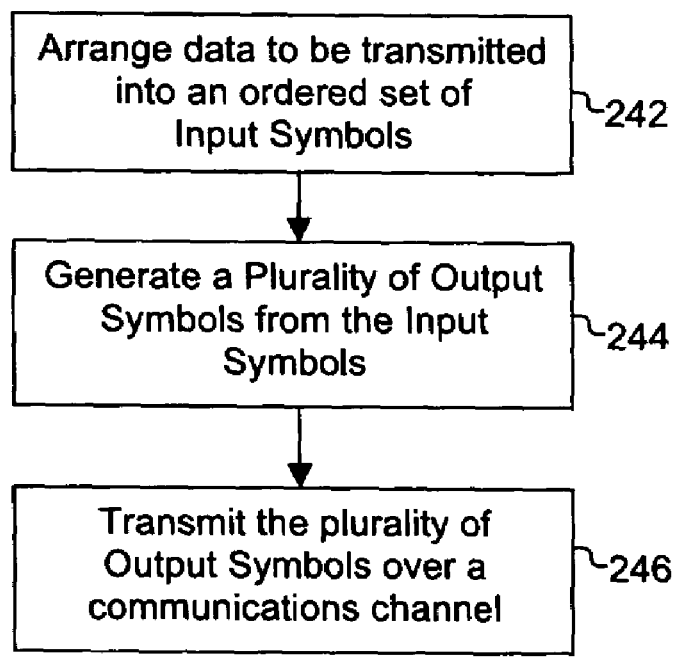
FIG. 2B illustrates a method of converting input symbols into a coded transmission using the broadcast transmitter shown in FIG. 2A in accordance with one embodiment of the present invention.
Figure 2A:
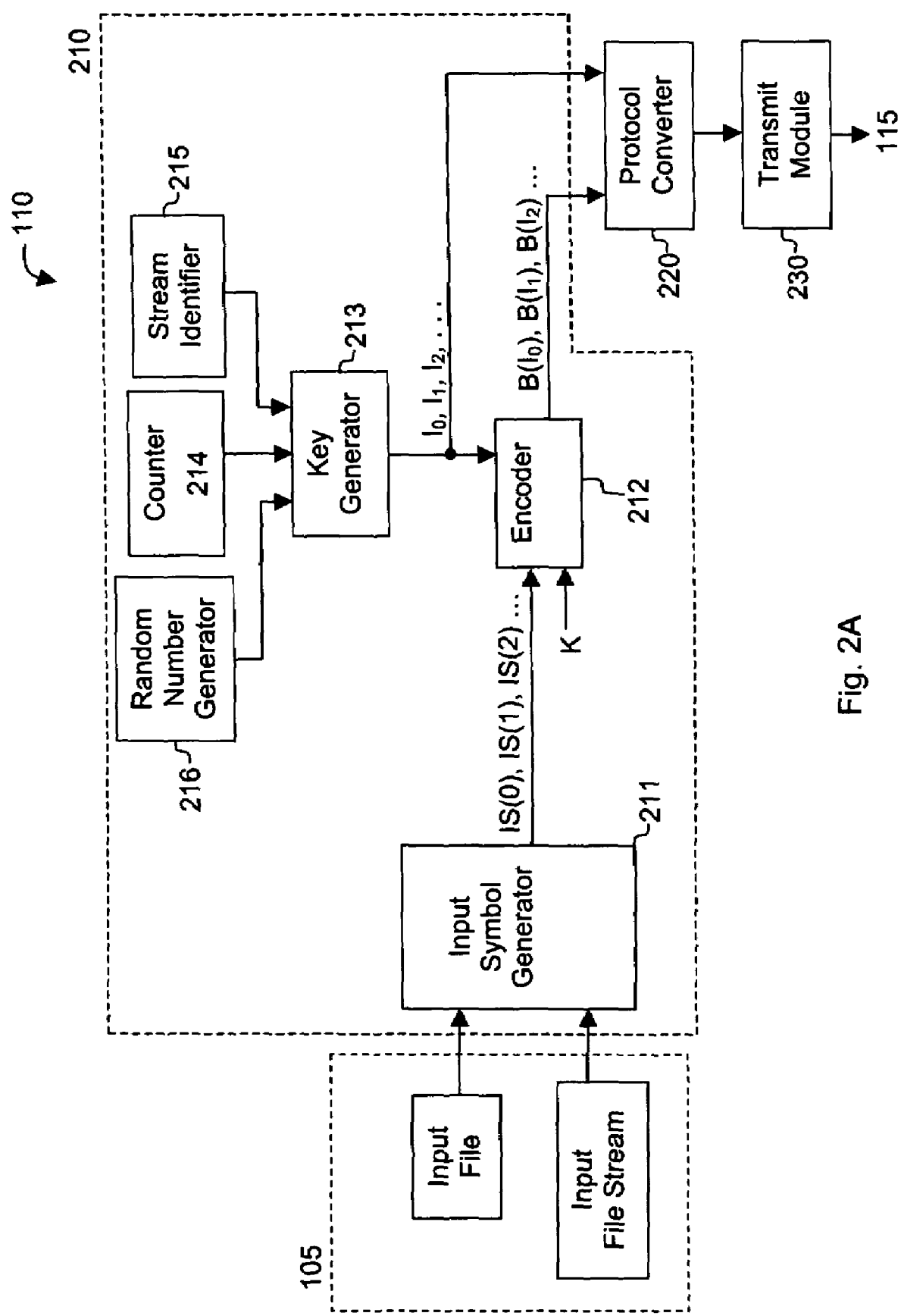
FIG. 2A illustrates a first embodiment of the broadcast transmitter shown in FIG. 1A in accordance with the present invention.

FIG. 2A illustrates a first embodiment of the transmitter 110, comprising a single-stage information additive code transmitter in accordance with the present invention. The term "transmitter" is used generically to refer to the unit's function, and may comprise a network server, central processing unit or other device from which instructions or data originate, a satellite or terrestrial radio transmitter, network device, or any such unit which is configured to encode and transmit source data as described herein.

The single-stage transmitter 110 includes a single-stage encoder 210, a protocol converter 220, and a transmit module 230. The single-stage encoder 210 includes an input symbol generator 211, symbol encoder 212, key generator 213, counter 214, stream identifier 215, and a random number generator 216. The single-stage encoder 210 and corresponding method of operation are generally as described in Luby I.

Input symbol generator 211 generates an ordered sequence of one or more input symbols (IS(0), IS(1), IS(Q), . . . ) from the source data 105, with each input symbol having a value and a position (denoted in FIG. 2A as a parenthesized integer). The possible values for input symbols, i.e., its alphabet, is typically an alphabet of $2^M$ symbols, so that each input symbol codes for M bits of the input file. The value of M is generally determined by the parameters of the system 100, but a general purpose system might include a symbol size input for input symbol generator 211 so that M can be varied from use to use. The output of input symbol generator 211 is provided to a symbol encoder 212.

Key generator 213 generates an encoding key for each output symbol to be generated by the symbol encoder 212. Each encoding key is generated according to one of the methods described herein, in Luby I, or any comparable method that insures that a large fraction of the keys generated for the same input file are unique, whether they are generated by this or another key generator. For example, key generator 213 may use a combination of the output of a counter 214, a unique stream identifier 215, and/or the output of a random generator 216 to produce each key. The output of key generator 213 is provided to the symbol encoder 212.

From each encoding key I provided by key generator 213, encoder 212 generates an output symbol, with a value B(I), from the input symbols provided by the input symbol generator. The value of each output symbol is generated based on its key and on some function of one or more of the input symbols, referred to as the output symbol's "associated input symbols." The selection of the function (the "value function") and the associates is done according to a process described in Luby I. Typically, but not always, M is the same for input symbols and output symbols, i.e., they both code for the same number of bits. In some embodiments, the number K of input symbols is used by the encoder to select the associates. If K is not known in advance, such as where the input is a streaming file, K can be just an estimate. The value K might also be used by symbol encoder 212 to allocate storage for input symbols.

The protocol converter 220 receives the output symbols and keys, and formats each to the protocol appropriate for the particular broadcast system. Exemplary broadcast protocols include TCP/IP, UDP/IP, MPEG, Digital Video Broadcast, satellite radio, terrestrial digital radio, as well as other network and/or broadcasting system protocols. In alternative embodiments of the transmitter 110 in which the protocol of the output symbols and keys do not require reformatting, the protocol converter 220 is omitted or bypassed.

The output symbols and keys are next supplied to the transmit module 230. The transmit module operates to broadcast the output symbols over the primary and/or secondary channels 120 and/or 140, and depending on the keying method used, the transmit module 230 might also transmit some data about the keys of the transmitted output symbols. The transmit module 230 can be any suitable hardware components, software components, physical media, or any combination thereof, so long as it is adapted to transmit output symbols and associated key information. The transmit module may comprise, for example, a multiplexer or a modulator operable to modulate the output symbols and key data onto a carrier signal, front-end electronics to condition the carrier signal as needed, and a signal transmission means, e.g., an antenna, optical lens/telescope, cable modem, network interface card, 802.11x radio card, or other similar devices to transmit the carrier signal, said carrier signal comprising the coded transmission. Any particular modulation format may be used, for instance, OFDM (orthogonal frequency division multiplexing), coded OFDM, QAM (quadrature amplitude modulation), CDMA (code division multiple access), QPSK (quadrature phase shift keying), and the like.

FIG. 2B illustrates a method of converting input symbols into a coded transmission using the single-stage transmitter 110 shown in FIG. 2A in accordance with one embodiment of the present invention. Initially at 242, the source data is arranged in an order set of input symbols, a process that is performed by the input symbol generator 211 in one embodiment. Subsequently at 244, a plurality of output symbols $B(I_0)$, $B(I_1)$, etc. are generated from the ordered set of input symbols IS(0), IS(1), etc., using the above-described symbol encoder 212, key generator 213, counter 214, stream identifier 215, and random number generator 216. In one embodiment, the output symbols are generated as a function of the input symbols IS(0), IS(1), etc. and corresponding encoding keys $I_0$, $I_1$, etc. In one embodiment, the function is an exclusive-or (XOR) operation, although any arithmetic function may be used in the alternative. Preferably, the number of output symbols is much larger than the number of input symbols in the ordered set. More preferably, at least one output symbol is generated from more than one, but fewer than all of the input symbols in the ordered set.

Next at 246, the plurality of output symbols is broadcast over a transmission channel (primary and/or secondary channels 120 and/or 140). In the preferred embodiment, the transmitted output symbols are decodable into the order set of input symbols when the quantity N of the transmitted output symbols are received, where N is greater than one, but much less than the number of possible output symbols.

Figure 3A:
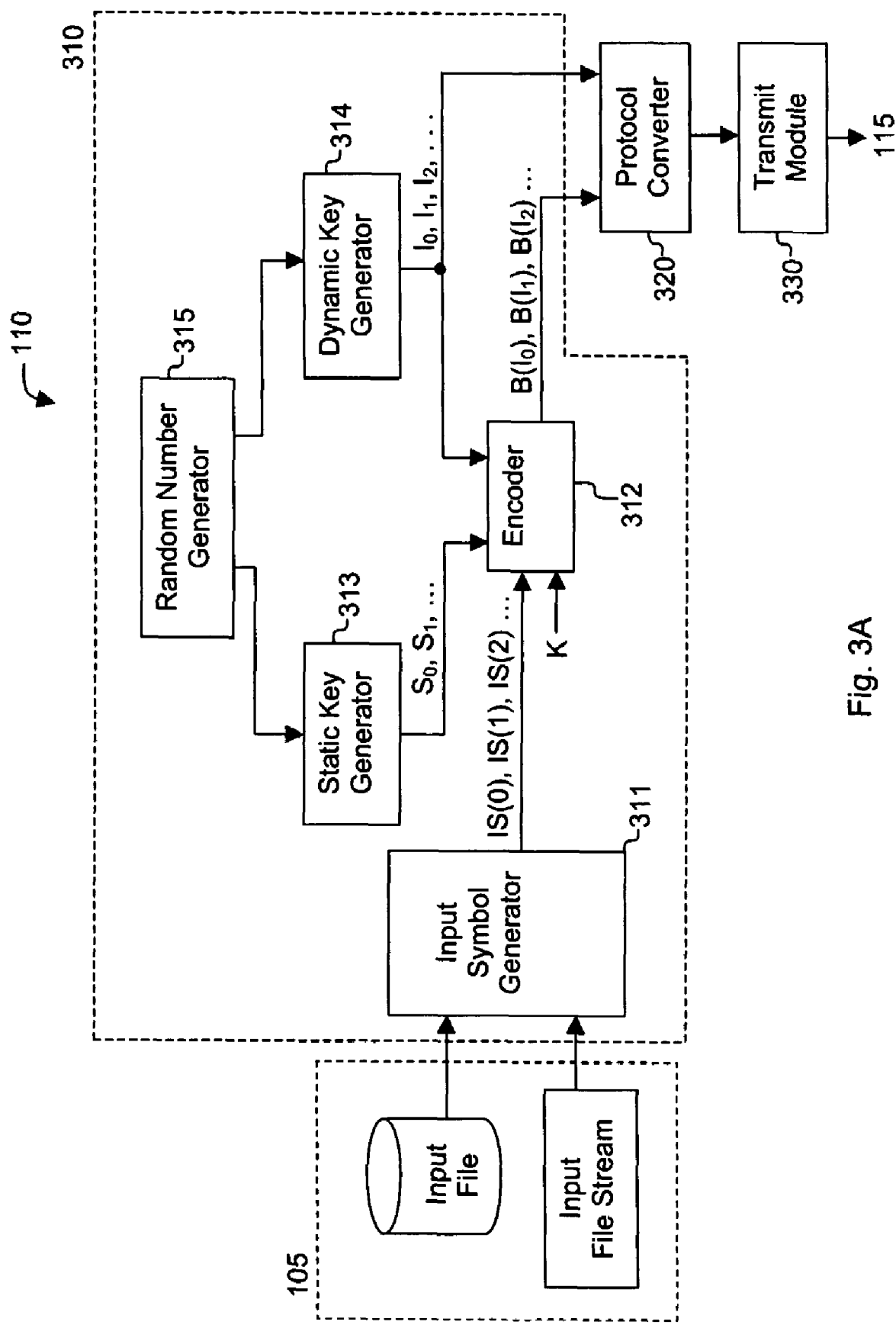
FIG. 3A illustrates a second embodiment of the broadcast transmitter shown in FIG. 1A in accordance with the present invention.

FIG. 3A illustrates a second embodiment of the transmitter 110 comprising a multistage information additive code transmitter in accordance with the present invention. Multistage encoding is particularly useful in the when the recipient joins or leaves the broadcast at times other then the commencement or termination of the broadcast. This scenario occurs frequently in broadcast applications, making the present invention particularly useful.

Multistage transmitter 110 of FIG. 3A is constructed similarly to the single-stage transmitter illustrated in FIG. 2A above, and includes a multistage encoder 310, a protocol converter 320 and a transmit module 330. The protocol converter 320 and transmit module 330 operate in the manner as described above in FIG. 2A. The multistage encoder 310 employs a two-stage coding scheme as described in Raptor.

During encoder operation, source data 105 is provided to the input symbol generator 311 which, in response, produces an ordered sequence of one or more input symbols IS(0), IS(1), IS(Q), . . . , each input symbol having a value and a position in the manner as described in FIG. 2A. The static key generator 313 produces the stream of static encoding keys in response to a seed value supplied to it by the random number generator 315. The dynamic key generator generates a dynamic encoding key for each output symbol to be generated. Preferably, each dynamic encoding key is generated so that a large fraction of the dynamic keys for the same input file are unique.

The symbol encoder 312 receives the ordered sequence of input symbols IS(0), IS(1), etc., a stream of static keys $S_0$, $S_1$, etc., and a stream of dynamic keys $I_0$, $I_1$, etc, producing, in response, respective output symbols $B(I_0)$, $B(I_1)$, etc. The value of each output symbol is generated based on its key, on some function of one or more of the input symbols, and possibly on one or more redundant symbols that had been computed from the input symbols. The collection of input symbols and redundant symbols which are correlated to a specific output symbol are referred to as being associated with that output symbol. In some embodiments, the number of K input symbols is used by the symbol encoder 312 to select the associated input symbols. If K is not known in advance, such as where the input is a streaming file, K can be estimated. The value of K may be used by the symbol encoder 312 to allocate storage for input symbols and any intermediate symbols generated by the symbol encoder 312.

Figure 3B:
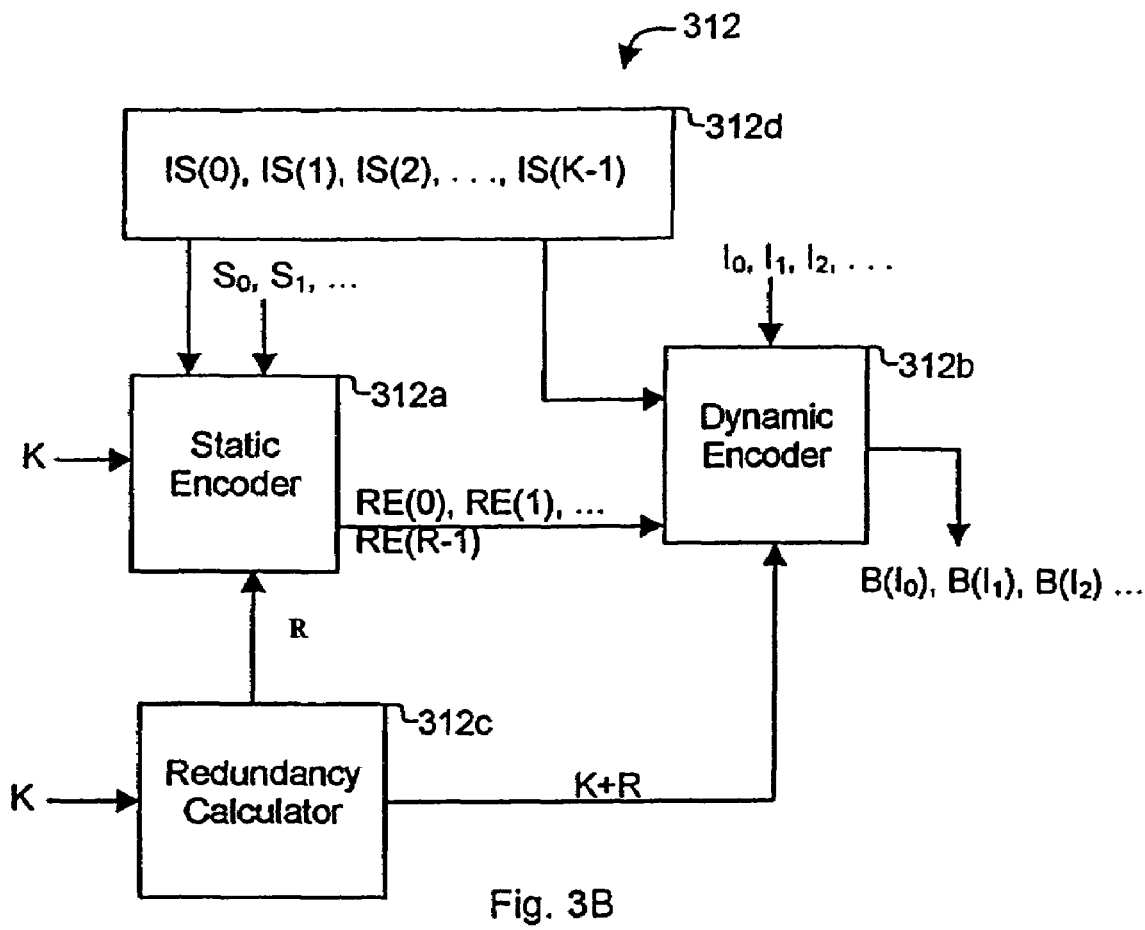
FIG. 3B illustrates one embodiment of the symbol encoder shown in FIG. 3A in accordance with the present invention.

FIG. 3B illustrates one embodiment of the symbol encoder 312 in accordance with the invention. The symbol encoder 312 includes a static encoder 312a, a dynamic encoder 312b, and a redundancy calculator 312c. The static encoder receives the sequence of input symbols IS(0), IS(1), etc., the number of K input symbols, a respective sequence of static keys $S_0$, $S_1$, etc., and a number R of redundant symbols. Responsive to these inputs, static encoder 312a generates a respective sequence of R redundant symbols RE(0), RE(1), etc. In some embodiments, the redundant symbols generated by the static encoder 312a are stored in an input buffer 312d. Input symbol buffer 312d may be only logical, i.e., the file may be physically stored in one place and the positions of the input symbols within the symbol buffer 312d could be only renamings of the positions of these symbols within the original file.

The dynamic encoder 312b receives the sequence of input symbols IS(0), IS(1), etc., dynamic encoding keys $I_0$, $I_1$, etc., and the sequence of redundant symbols RE(0), RE(1), etc. and, in response, generates the output symbols $B(I_0)$, $B(I_1)$, etc. In the embodiment in which the redundant symbols are stored in the input symbol buffer 312d, the dynamic encoder 312b receives the input symbols and redundant symbols from the input buffer 312d. The redundancy calculator 312c is operable to compute the number R of redundant symbols from the number K of input symbols, a process which is further described in the Raptor reference incorporated herein.

Figure 3C:
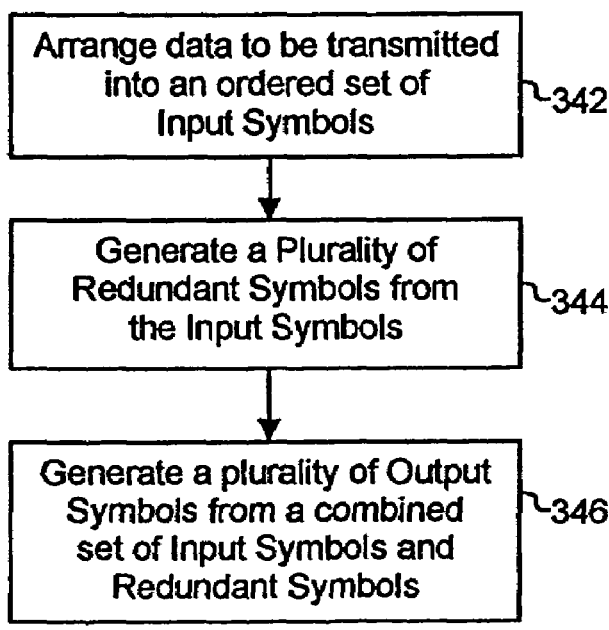
FIG. 3C illustrates a method of converting input symbols into a coded transmission using the broadcast transmitter shown in FIG. 3A in accordance with one embodiment of the present invention.

FIG. 3C illustrates a method of converting input symbols into a coded transmission using the multistage transmitter 110 shown in FIG. 3A in accordance with the present invention. Initially at 342, the source data is arranged in an order set of input symbols IS(0), IS(1), etc., a process that is performed by the input symbol generator 311 in one embodiment. Subsequently at 344, a plurality of redundant symbols RE(0), RE(1), etc. is generated as a function of input symbols IS(0), IS(1), etc. and corresponding static keys $S_0$, $S_1$, etc., as described in FIG. 3B. Next at 346, a plurality of output symbols $B(I_0)$, $B(I_1)$, etc. is generated from a combined set of the input symbols IS(0), IS(1), etc. and the redundant symbols RE(0), RE(1), etc., and the output symbols broadcast over a transmission channel (primary and/or secondary channels 120 and/or 140). In the preferred embodiment, the number of output symbols is much greater than the number of symbols in the combined set of input and redundant symbols. More preferably, at least one output symbol is generated from more than one, but fewer than all of the combined symbols.

The above-described encoders 210 and 310, protocol converters 220 and 320, and transmit modules 230 and 330 may individually be realized in a variety of forms, such as in hardware, in software/firmware, or a combination of these components. When partially or entirely implemented in software or firmware, the required functionality may be provided by instruction code which controls a computer, microprocessor, or other programmable system to perform the described processes. In such embodiments, the instruction code may be stored on a readable medium such as a hard drive, other disk, microprocessor memory, or other such device that is suitable to store the instruction code. Further, encoders 210 and 310, protocol converters 220 and 320, and transmit modules 230 and 330 may be collectively integrated in varying degrees, depending upon the particular application. For example in a satellite broadcast application, the multistage encoder, protocol converter (if employed), and transmit module may be located within a single appliance at the satellite ground station and/or on-board a spacecraft transceiver. In another embodiment, the encoder and transmit module may be separately located. Those skilled in the art will appreciate integrated systems of varying configurations are envisioned under the present invention.

The foregoing are only exemplary of the systems and methods for generating and transmitting information additive coded data. Further embodiments are described in Raptor and Luby I.

Pre-Encoding Data Segmenting and Loading

In some embodiments of the present invention, the process of broadcasting data from a transmitter to one or more receivers using information additive codes in accordance with the present invention is subdivided into several sub-processes generally defined as an upload phase, a preparation phase, a transmission phase, a decoding phase, and a storage phase.

The upload phase is the period in which the data is uploaded onto the encoding server. The encoding server can be any device capable of storing an appropriate amount of data, performing computations on the stored data, and sending the data to one or more clients. In some applications, the upload phase of the data may be negligible, for example when the data is directly created on the transmitting server. In other applications, the upload phase may be substantial, for example when the data is created and stored on an external storage device and has to be transported to the transmitting server.

Once the upload phase is completed, the data may need to be prepared for encoding. For example, when an information additive coding system as described in Raptor is used, it may be desirable to preprocess the data and compute static encoding symbols before the transmission commences. Where traditional FEC schemes are used, it may sometimes be desirable to compute a part, or all of the encoding symbols before they are transmitted. The phase between the completion of the upload and the commencement of the transmission is referred to as the preparation phase.

The transmission phase is the period in which encoding symbols are transmitted to the recipient(s). In some cases, encoding may continue during the transmission phase. For example, this could be the case when information additive codes are used. The encoding symbols may be transmitted using the User Datagram Protocol (UDP) via unicast, or multicast, if applicable.

Decoding of the received information may be triggered if some or all of the required number of encoding symbols are received by the client. For example, where information additive coding is used as explained in Luby I or Raptor, the decoding may be triggered when an amount of encoding symbols is received that is slightly larger than the original amount. In other embodiments the decoding may be triggered when a substantially smaller amount of encoding symbols are received. The decoding phase is the period between the commencement of the decoding procedure and the complete recovery of the data, in case of successful decoding, or, if decoding is not possible, an indication that decoding is not possible and termination of the decoding process.

Once decoding is complete, the data may be stored on a storage device which may be remotely located from the client. For example, the data can be stored on a shared data server so it can be commonly used by a number of users. In that case, the decoded data is transferred to the storage device. The storage phase is the period between the termination of the decoding process, and the commencement of the storage process on an external storage device.

The upload, preparation, decoding, and storage phase of a data transmission scheme using some form of information additive coding may increase the total transmission time. The time needed for each of these steps may depend substantially on the size of each encoding section (an encoding section is a piece of the data that is being encoded). In some applications, this piece can be the entire data. In other applications, the piece may be substantially smaller.

The time added to the raw transmission time by the phases of upload, preparation, decoding, and storage can be a small fraction of the total transmission time. This is true, for example, where the link between the server and the client admits only low speeds, whereas the link between the storage device and the transmission server as well as the link between the client and the final storage device for the data is very fast, and the computing resources on the transmission server and the client allow for very fast preparation and decoding.

In some cases the additional time spent for upload, preparation, decoding, and storage make up a substantial fraction of the total transmission time. For example, in a transmission scenario where the data to be transmitted resides on a server different from the transmission server, and the link between the transmission server and the storage server is a 100 megabit per second (Mbps) link, then the upload time for a file of size 500 megabytes (MB) is 40 seconds. If the speed of the preparation phase is also 100 Mbps, then the preparation phase also requires 40 seconds. If the link between the transmitting server and the client admits a transmission rate of 50 Mbps, and the data is sent to the client via UDP without employing rate control, then the transmission time of the file is at least 80/(1−p) seconds, wherein p is a real number between 0 and 1 indicating the percentage of symbols lost during transmission. For example, if p is 1%, then the transmission time is at least 80.81 seconds. If the speed of the decoding is also 100 Mbps, then the decoding step requires 40 seconds as well. Assuming that the client may be able to transmit the decoded file to the external storage device at a speed of 100 Mbps, the storage phase adds an additional 40 seconds to the transmission time. If encoding is not performed substantially concurrently with the uploading, decoding is not performed substantially concurrently with the reception, and storage is not performed substantially concurrently with the decoding, then the various phases of the transmission add up to 240.81 seconds, of which only 80.81 seconds is the real transmission. The raw transmission time is increased by a factor of almost 3. Thus, in some embodiments of the invention, a system and process is useful in reducing the aforementioned upload, preparation, decoding, and storage processes.

Figure 4A:
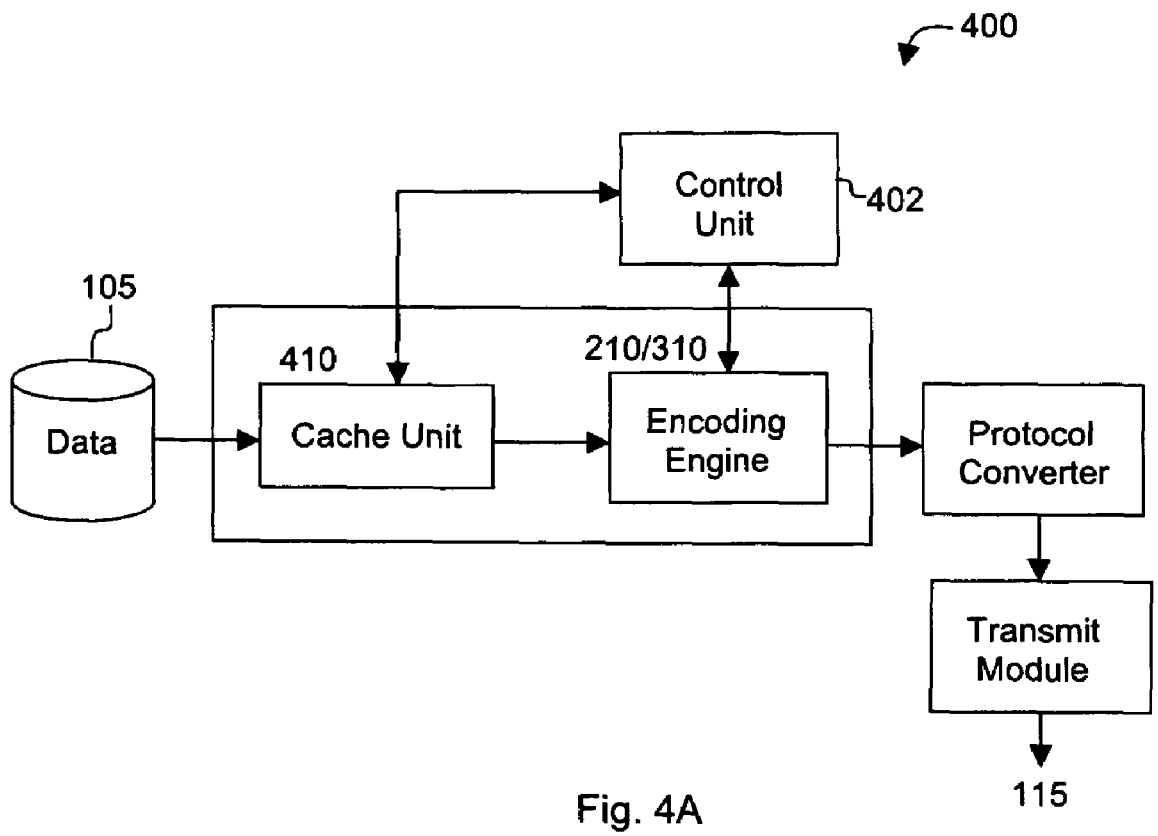
FIG. 4A illustrates a simplified block diagram of an improved encoder in accordance with the present invention.

FIG. 4A illustrates a simplified block diagram of an improved encoder 400 in accordance with one embodiment of the present invention. The improved encoder 400 includes a control unit 402, a cache unit 410 and an encoding engine previously described as the single or multistage encoders 210 or 310, respectively.

The cache unit 410 is operable to retrieve parts of the data 105 and provide it to the encoding engine 210/310 for encoding. The size of the parts retrieved constitutes the size of a section encoded by the encoding engine, and may be communicated to the control unit 402 which forwards the information to the client via the out-of-band communication.

In one embodiment, encoding is performed on a part of the data 105, while another part is retrieved into cache unit 410. Various types of resources needed for performing the encoding scale with the size of the encoding section. Such resources may include computational resources, and memory resources. By reducing the size of each encoding section, the total demand for resources on the server decreases.

Figure 4B:
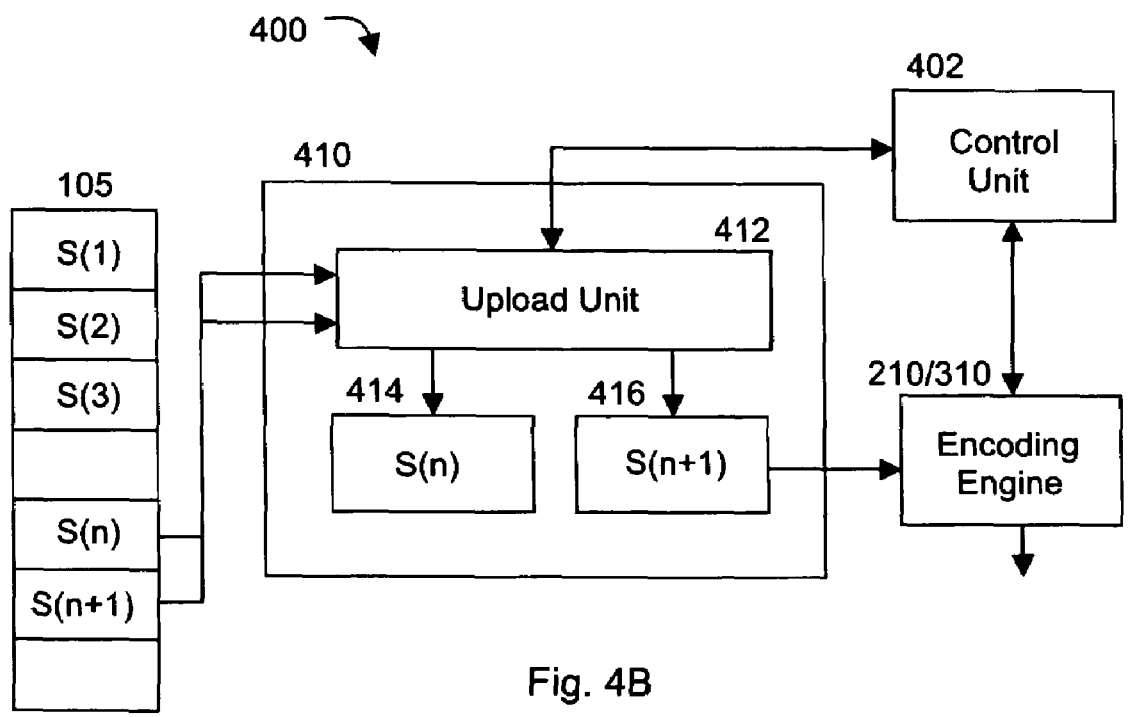
FIG. 4B illustrates a method for encoding data with the improved encoder shown in FIG. 4A in accordance with one embodiment of the present invention.

FIG. 4B illustrates a first embodiment of the improved encoder 400 in accordance with the present invention, with previously identified features retaining their reference numerals. As shown, the cache unit 410 includes an upload unit 412, and two data buffers 414 and 416, the size of which is chosen so that each holds two consecutive segments S(n) and S(n+1) of the data 105. Those skilled in the art will appreciate that any number and/or size of buffers may be chosen in other embodiments of the invention.

During operation, the data file or stream is subdivided into sections S(1), S(2), etc. If data 105 refers to a stream, not all of the sections may be available at the time of transmission. In the following descriptions of whether an operation is performed on a section, it is implicitly assumed that the section is available at the time when the operation is performed. If not, the operation will wait for the section to become available.

In one embodiment the sizes of all sections, except possibly the last, are equal. In another embodiment, the sizes of the different section may be substantially different. In one embodiment, the size of each section can be computed by the upload unit 412 and communicated to the control unit 402 and the encoding engine 210/310. In another embodiment the size of the sections can be selected by the operator and communicated to the control unit 402 and encoding engine 210/310. In another embodiment, the size of the sections can be selected by the operator and communicated to cache unit 810, for example via an application program interface (API). In yet another embodiment, the control unit 402 computes the sections sizes and communicates it to the upload unit 412, and the encoding engine 210/310.

After determining the size of each section, the upload unit 412 retrieves the first section S(1) of the data 105 and stores it in the buffer 416. Once storage is complete, that section is forwarded to the encoding engine 210/310 for encoding. At the same time, the next section S(2) is retrieved and put into the buffer 414. The encoding engine 210/310 generates encoded data for the first section. It may terminate the process when instructed by the control unit 402. The same termination message may also be sent to the upload unit 412. At this point, the upload unit 412 may forward the contents of buffer 414 to the encoding engine, retrieve section S(3) from the data 105, and put it into buffer 416. The encoding engine continues generating encoded data for S(2) until instructed by the control unit 402 to stop. In general, once the encoding engine 210/310 and upload unit 412 receive an instruction from the control unit 402 to terminate encoding section S(n−1), section S(n) is forwarded to the encoding engine and section S(n+1) is retrieved from data 105 and buffered. The process may continue indefinitely, or until upload unit 412 is instructed by the operator or other external signal to stop, or continue until all of the data 105 has been transmitted.

In one embodiment in which the recipient wishes to receive only parts of the data 105 exactly, some sections of data 105 may be transmitted without coding, while others may be coded. For example, where data 105 corresponds to a live stream, and the source coding method used for digitization allows for layering the data into parts of various levels/sections, such an embodiment could be used to encode some levels/sections while sending other levels/sections without coding.

Figure 4C:
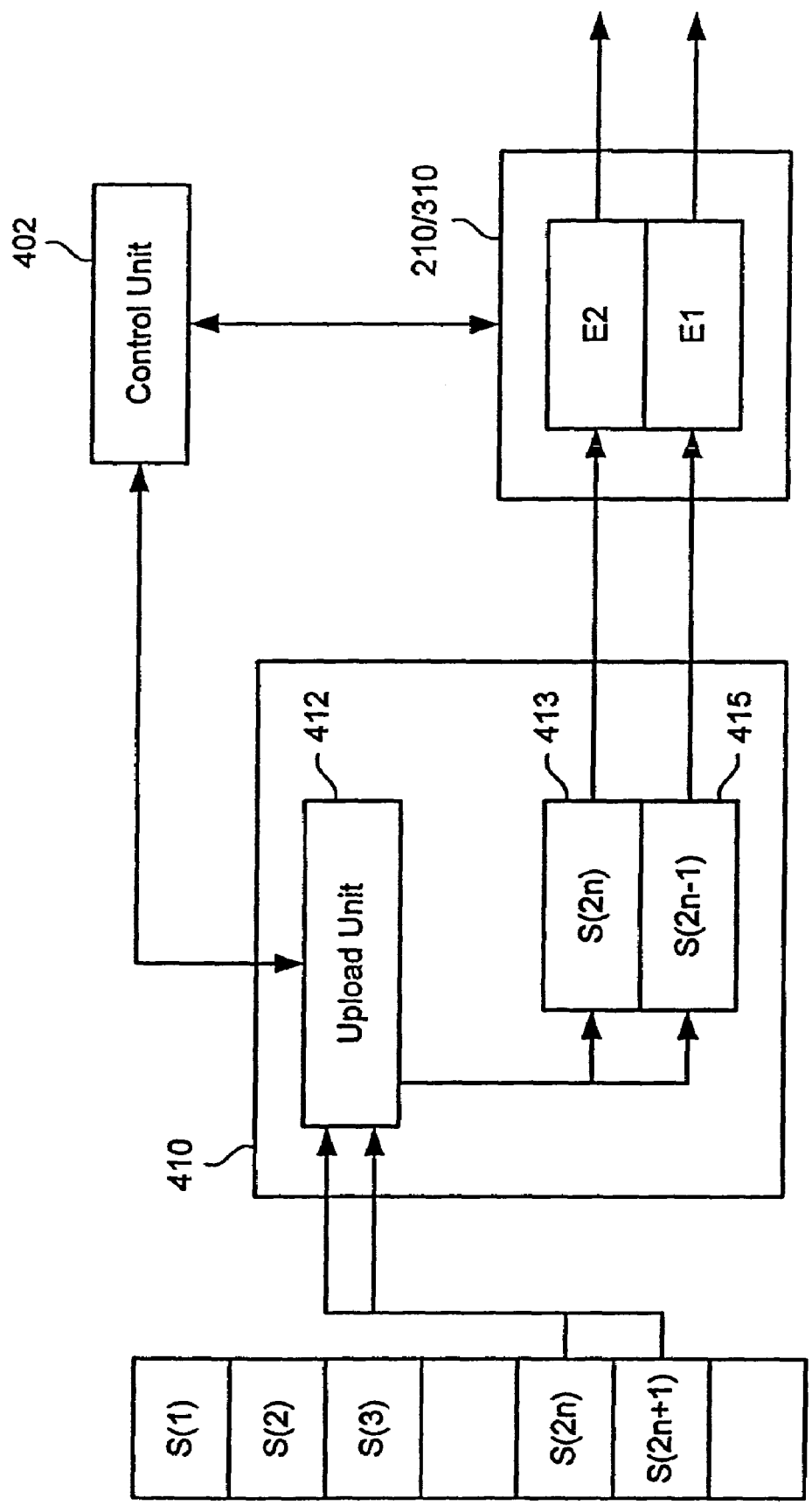
FIG. 4C illustrates a second embodiment of the improved encoder comprising a multiple engine encoder.

FIG. 4C illustrates a second embodiment of the improved encoder 400, comprising a multiple engine encoder. The multiple-engine encoder 400 is comprised of two engines E1 and E2, embodiments of which are described in FIGS. 2A and 3A above. While two encoding engines are shown, a larger number of engines may be used in alternative embodiments under the present invention.

Upon initiating a download, the cache unit 410 fetches the first section S(1) and forwards it to encoding engine E1 for encoding. At the same time, it fetches S(2), and forwards it to encoding engine E2 for preparation of encoding. Encoding engine E2 could also start encoding section S(2) and storing encoding information into a buffer for future transmission. Once the 'done message' for section S(1) is received by control unit 402, it may instruct the encoding engine E1 and the upload unit 412 to drop Section S(1). Upon receiving this request, the upload unit 412 instructs E2 to start encoding section S(2); alternatively, if encoding information has already been generated, it could be supplied to the protocol converter (if required) and subsequently to the transmit module. At the same time, section S(3) is fetched from data 105, stored in buffer 415, and forwarded to encoding engine E2. Similarly, encoding engine E2 prepares section S(3) for encoding, or, in case of availability of memory, starts encoding section S(3) and storing encoding information into a buffer for future transmission. In general, encoding engine E2 encodes sections with an even index $2n$, and encoding engine E1 encodes sections with an odd index $2n+1$, wherein n is an integer greater than or equal to 1. Once section $S(2n-1)$ is finished, encoding engine E2 starts encoding section $S(2n)$, and the upload unit 412 fetches section $S(2n+1)$ (if it exists) and forwards it to encoding engine E1 for preparation for encoding. Similarly, once section $S(2n)$ is finished, encoding engine E1 starts encoding section $S(2n+1)$, and the cache unit fetches section $S(2n+2)$ and forwards it to encoding engine E2 for preparation for encoding.

The foregoing example is for illustrative purposes only, and additional buffers may be used in alternative embodiments under the present invention. For example, in the case of three buffers, the first one would be used to produce encoding symbols for section $S(3n-2)$, while the second one would be used to prepare section $S(3n-1)$ for encoding, and at the same time, section $S(3n)$ would be uploaded into the third data buffer. The larger number of buffers may lead to a further decrease of upload, preparation, and decoding times.

As mentioned above, the size of the sections $S(1)$, $S(2)$, . . . depends on a number of parameters. On the one hand, the sections chosen should not be too small, since this may lead to inefficiencies in the transmission. For example, where the channel has a round trip time (RTT) of 250 milliseconds (ms), each section is served for 250 ms longer than is needed. If the channel has a bandwidth of 10 Mbps, then this translates to 320 kilobytes (KB). If the section size is less than this amount, then at least 50% of the bandwidth in channel 155 is wasted. To keep the wasted bandwidth at 1% or less, the section size needs to be more than 31 megabytes (MB).

In some embodiments of the present invention, the delay incurred by late reception of the 'done message' may be substantially reduced by transmitting a section at a rate that varies over time. The exact variation of the transmission rates depends on the application. In one embodiment, the rate at which the first section is served could decrease over time, and at the same time, the rate at which the second section is transmitted is increased over time. Once the 'done message' for the first section is received, the first section is dropped and the process continues with sections 2 and 3, and so forth. The number of sections served substantially concurrently is not limited by two, but could take on any value, as long as the resources on the server would allow that.

Although very small section sizes may lead to transmission inefficiencies, sections of too large a size could lead to a waste of server and client resources, and could add an additional delay to the transmission. For example, suppose that the data transmitted is data of size 500 MB, that the section size is 50 MB, that the connection between a server and a storage device storing the data has a bandwidth of 100 Mbps, that the preparation speed for the section is also 100 Mbps, and that the connection between client and the storage device storing the data has a bandwidth of 100 Mbps. Then the total transmission time for the data is equal to the time to upload, prepare, decode, and store one section, plus the time needed for the transmission of the entire data. With 1% loss, the latter equals 80.81 seconds, and the former equals 16 seconds, leading to a total transmission time of 96.81 seconds. If the section size is 100 MB, then the delay caused by uploading, preparing, decoding, and storing a section is proportionally larger and equal to 32 seconds, leading to a total transmission time of 112.81 seconds.

Large sections could also add to the amount of memory used by the server and by the client. For reasons of speed, it is advantageous to perform the encoding and decoding operations in the Random Access Memory (RAM) or other fast access memory devices on the server and on the client, rather than reading from and writing to disk. In such an embodiment, the server and the client preferably include enough memory to store at least the amount of two sections. To keep the memory resources low, the section sizes need thus to be chosen appropriately.

Various methods can be used to decrease the memory requirements on the server and on the client. On the client side one embodiment of such a method is the following: while decoding the section $S(n-1)$, the space freed by the decoded content is used to store incoming encoded information about section $S(n)$. Under favorable conditions with respect to the decoding speed and the transmission speed, the memory requirement for the client side can be decreased by a factor of 2. Other methods using sophisticated interleaving techniques similar to those described in Rasmussen can be employed to reduce the memory requirements on the server and the client side, as will be apparent to those skilled in the art upon studying Rasmussen document and its references.

In one embodiment of the present application the section sizes are chosen to have different sizes. For example, where the server can upload data faster than it can transmit, it is possible to use section sizes that grow over time to facilitate faster start up times on the server. For example, the methods provided in MOD may be used to compute various section sizes and scheduling algorithms for their activation. The different section sizes can also be used to support multiple clients that experience different fractions of losses. For example, recipients could select which sections to receive in a similar way as described in MOD, except that only a limited number of sections are serving at the same time. Then the fact that the section sizes are growing improves the chances that multiple recipients receive concurrently from the same sections towards the end of the transmission. In particular, in a configuration where the recipients start receiving at the same time, if recipients have a maximum loss rate, then the section size growth can be calculated to ensure that at any point in time only a small number of sections need to be served concurrently.

For example, in a case where the next section size is a factor of $\alpha$ larger than the previous one, with $\alpha$ being a real number larger than or equal to one, and where each client experiences a maximum loss rate of 20%, then if $\alpha$ is chosen to be at least 1.25, and the sections are transmitted using a chain reaction coding system or a traditional FEC code with a rate of at most 0.8, and where the clients commence the download at the same time, then it can be shown that the server needs to broadcast only two sections at a time to ensure that all clients receive the entire content. The results of MOD can be used to obtain good sectioning schemes in scenarios where the server resources or the client resources, e.g., memory or CPU speed, are constrained.

Post-Encoding Processes

In applications where the transmission and delivery of a live data stream is desired, the aforementioned encoding processes may be modified or augmented in order to reduce latency in the coding and decoding processes. Specific systems and methods for reducing latency are described in Rasmussen.

Figure 5A:
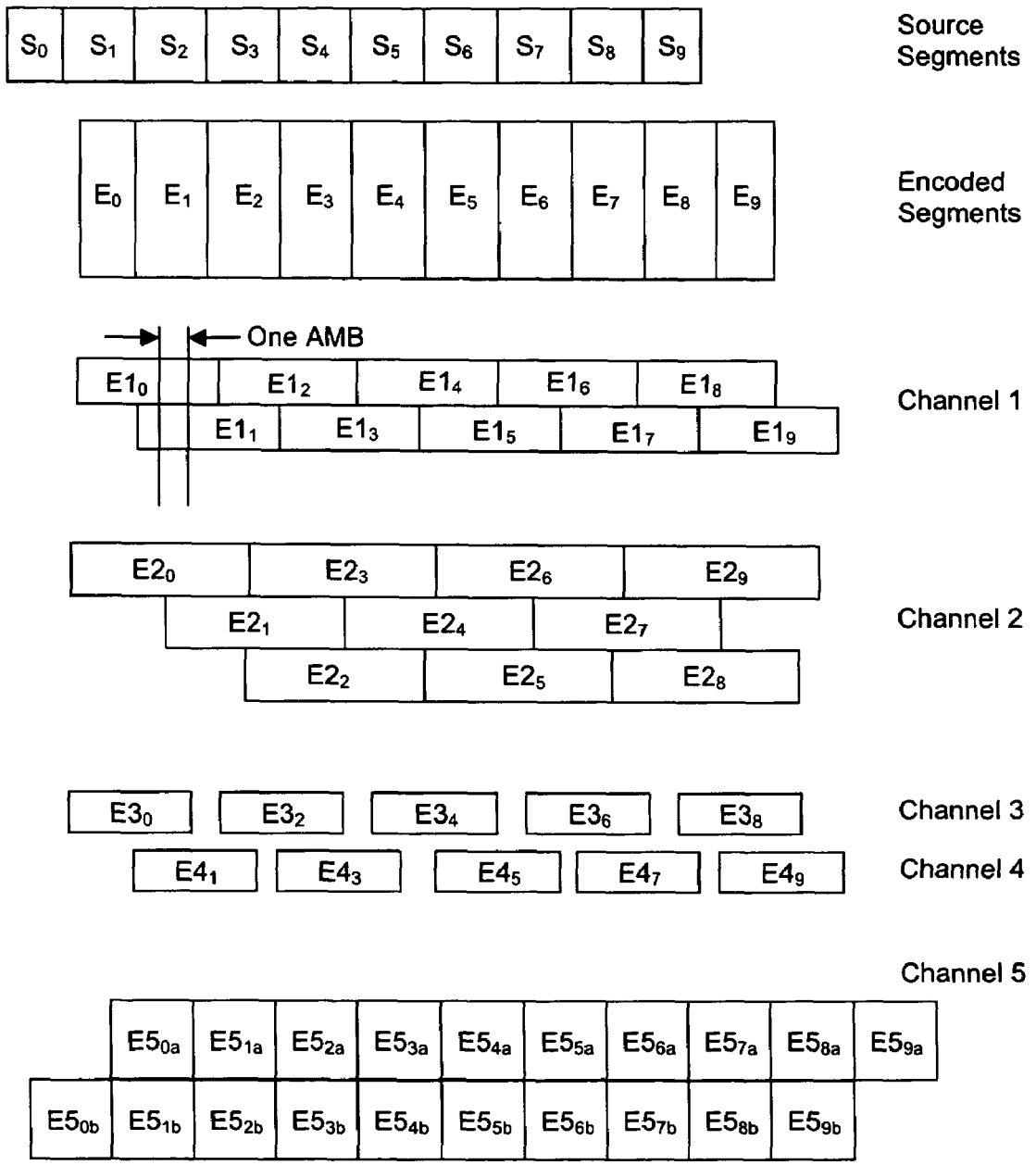
FIG. 5A illustrates a general encoding process which may be used in system broadcasting live streaming data.

FIG. 5A illustrates a general encoding process which may be used in system broadcasting live streaming data. Initially, the live data stream is partitioned into time-ordered segments $S_0, S_1, S_2, \ldots$, with common duration t seconds and common length K AMBs. (The live data stream may not naturally be in the same format as the transmission medium, but we may use the same units without loss of generality.) The data partitioning may include those processes described in FIGS. 8A-C below.

Subsequently, an FEC (forward error/erasure correction) code, such as information additive coding, is applied separately to each $S_i$, the output of the code denoted $E_i$. Each $E_i$ has length N AMBs. The N AMBs for $E_0$ are transmitted on the medium, followed by the N AMBs for $E_1$, etc. At the time when segment $S_i$ is to be recovered, some fraction of the AMBs of $E_i$ are available. The FEC code guarantees that if L of the AMBs are available, $S_i$ can be recovered. The value of L is a property of the particular coding employed. Reed-Solomon codes have the desirable property that L=K; however, the complexity of decoding necessitates small values for K and N. Information additive codes as described in Luby I and Raptor have L slightly larger than K and low complexity of decoding.

Figure 5B:
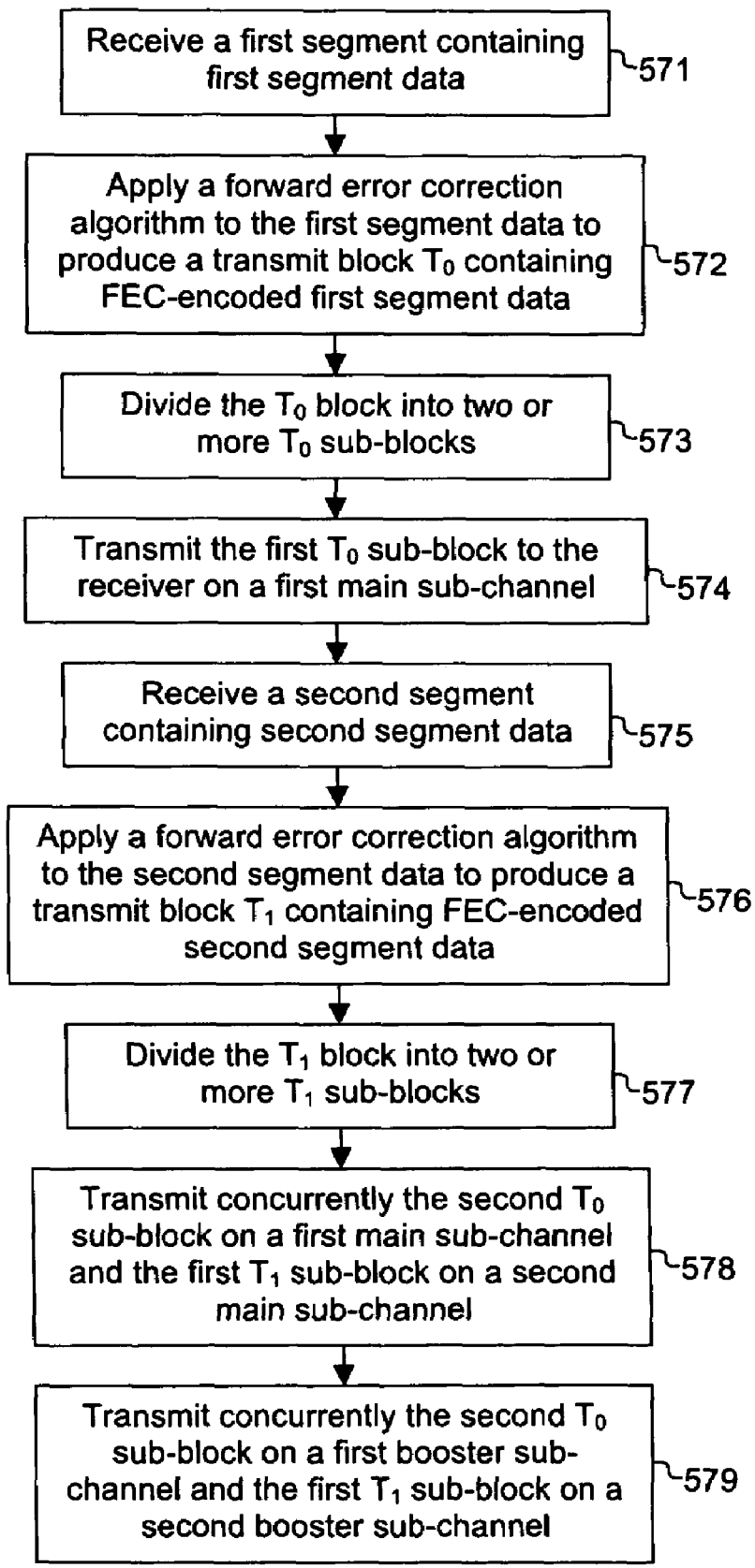
FIG. 5B illustrates a specific embodiment for the encoding process for a live data stream in accordance with the present invention.

FIG. 5B illustrates a specific embodiment for encoding the process for a live data stream in accordance with the present invention. The process begins at 571, when the first segment $S_0$ containing first segment data is received. Next at 572, a forward error correction algorithm is applied to the first segment data to produce a first transmit block $T_0$ containing the FEC-encoded first segment data. In a specific embodiment, the FEC employed is information additive codes, as described and incorporated herein. In the signal timing diagram of FIG. 5C, the applied forward error correction coding outputs the FEC-encoded segment data after all of the first segment data is received. In an alternative embodiment, the FEC-encoded data is produced as the segment data is being received.

Figure 5C:
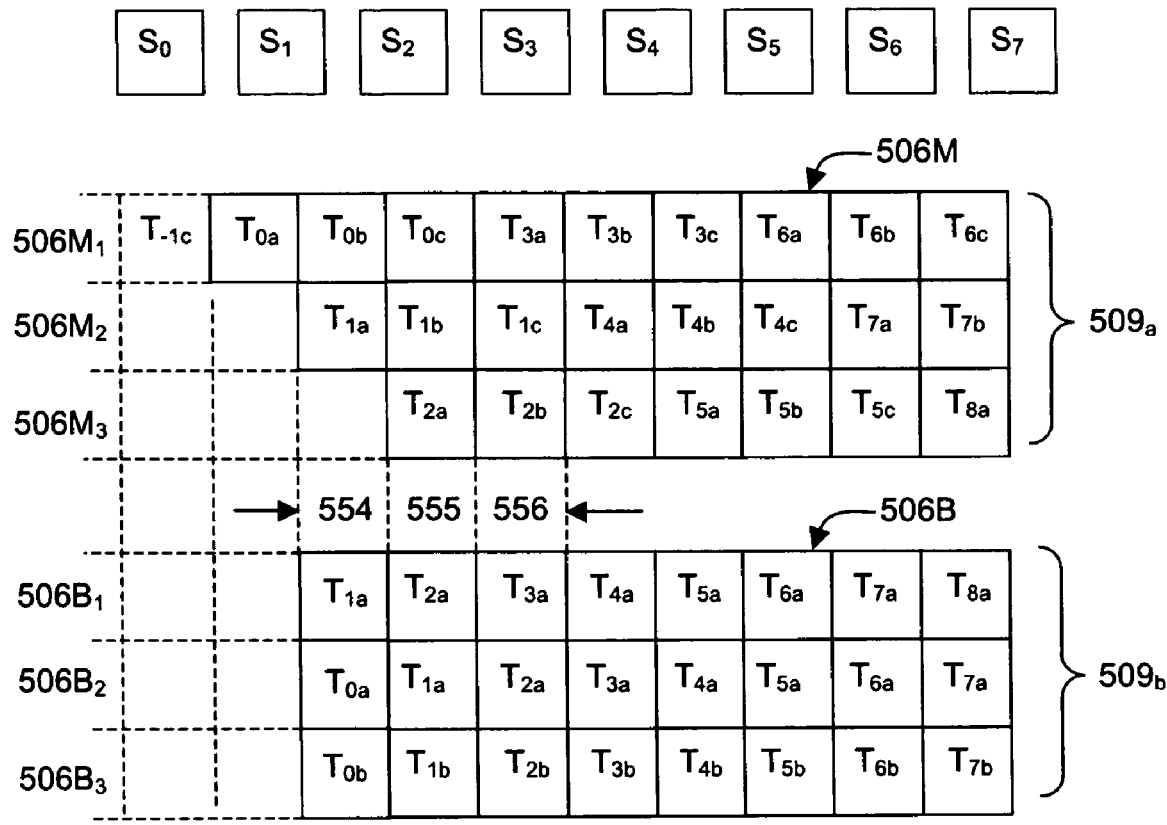
FIG. 5C illustrates a signal timing diagram for signals communicated in accordance with the method of FIG. 5B.

At 573, first transmit block $T_0$ is subdivided into two or more subblocks. In the exemplary embodiment of FIG. 5C, the first transmit block $T_0$ is subdivided into three subblocks $T_{0a}$, $T_{0b}$, and $T_{0c}$. In the preferred embodiment, subblocks $T_{0a}$, $T_{0b}$, and $T_{0c}$ each comprise distinct data, i.e., they contain minimal, if any, common data. Next at 574, a first of the two or more subblocks is transmitted on a first main subchannel. As shown in FIG. 5C, the first subblock $T_{0a}$ is transmitted on a first main subchannel $506M_1$.

Next at 575, the second segment $S_1$ containing first segment data is received. A forward error correction algorithm is subsequently applied to the second segment data to produce a first transmit block $T_1$ containing the FEC-encoded second segment data (process 576). At 577, the second transmit block $T_1$ is subdivided into two or more blocks, which, in FIG. 5C comprises three blocks $T_{1a}$, $T_{1b}$, and $T_{1c}$. As above, subblocks $T_{1a}$, $T_{1b}$, and $T_{1c}$ each preferably comprise distinct data.

At 578, the second subblock $T_{0b}$ is transmitted on the first main subchannel $506M_1$ substantially concurrent with the transmission of the first subblock $T_{1a}$ on the second main subchannel $506M_2$. At 579, there is the concurrent transmission of $T_{1a}$ on the first booster subchannel $506B_1$ and $T_{0a}$ on the second booster subchannel $506B_2$.

As the signal timing diagram of FIG. 5C illustrates, the aforementioned process may be repeated for additionally received segments $S_2$-$S_7$, in which each segment is received, forward error corrected to a transmit block $T_{2-7}$, each transmit block divided into two or more subblocks, and the subblocks transmitted on the main and booster subchannels as shown. In the preferred embodiment, the number of subdivided blocks determines the number of receiver and booster subchannels, the total bandwidth of which equals the reception rate 509.

In the particular embodiment of FIG. 5C, a first subblock sequence, $T_{ia}$, i.e., $T_{1a}, T_{2a}, T_{3a}, \ldots$ is transmitted along the first booster subchannel $506B_1$. As further illustrated, the first subblock transmit sequence one block delayed, i.e., $T_{0a}$, $T_{1a}, T_{2a}, T_{3a}, \ldots$ is transmitted along the second booster subchannel $506B_2$ The third booster channel $506B_3$ transmits a second subblock sequence $T_{ib}$, i.e., $T_{0b}, T_{1b}, T_{2b}, T_{3b}, \ldots$ A receiver in the system may have sufficient bandwidth to simultaneously monitor both the main channel 506M and the booster channel 506B. In another embodiment, the receiver channel is limited, for example, by its particular design, by network congestion, or by signal interference to monitor only one channel. In the latter case, the receiver is preferably configured to monitor the booster channel 506B initially, and can switch its reception to receive transmit blocks $T_i$ either on the booster channel 506B or on the main channel 506M.

During reception, the receiver listens to the booster channel 506B for the first transmit blocks, which comprises $T_{0a}$, $T_{0b}$ and $T_{1a}$ in the time slot 554. The receiver subsequently switches to the main channel 506M to receive transmit blocks $T_{0c}, T_{1b}, T_{2a}$ during the next transmit slot 555. The corresponding pieces of the received subdivided data are assembled, e.g., $T_{0c}, T_{1b}$ & $T_{1c}, T_{2a}, \ldots$ and FEC-decoded to recover the corresponding segment data. As illustrated, transmissions over the first and second time slots 554 and 555 will result in two-thirds of the second transmit block $T_1$ data being recovered ($T_{1a}$ & $T_{1b}$), which may be sufficient to recover the data contained within corresponding segment block $S_1$. As the process continues in time slots 556 and beyond, the later-occurring transmit subblocks $T_{2i}, T_{3i}$, etc. will be received, the transmit blocks $T_2$, $T_3$, etc. reconstructed, and the data contained within their corresponding segments $S_2$, $S_3$ recovered.

The foregoing is only exemplary of the systems and methods for processing information additive codes for transmission and reception. Further embodiments are described in Rasmussen.

Exemplary Broadcast Receivers and Processes

Figure 6B:
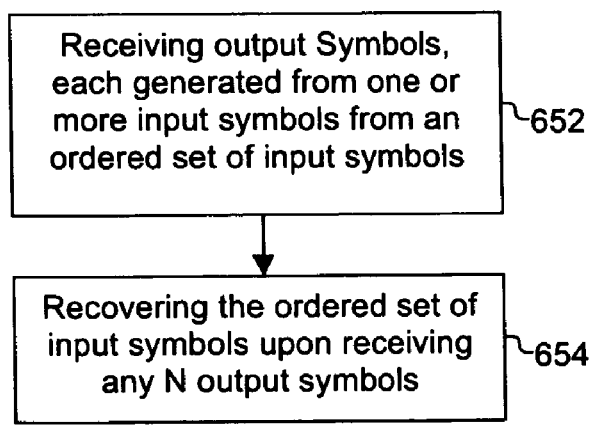
FIG. 6B illustrates a method of recovering input symbols from a coded transmission using the receiver shown in FIG. 6A.
Figure 6A:
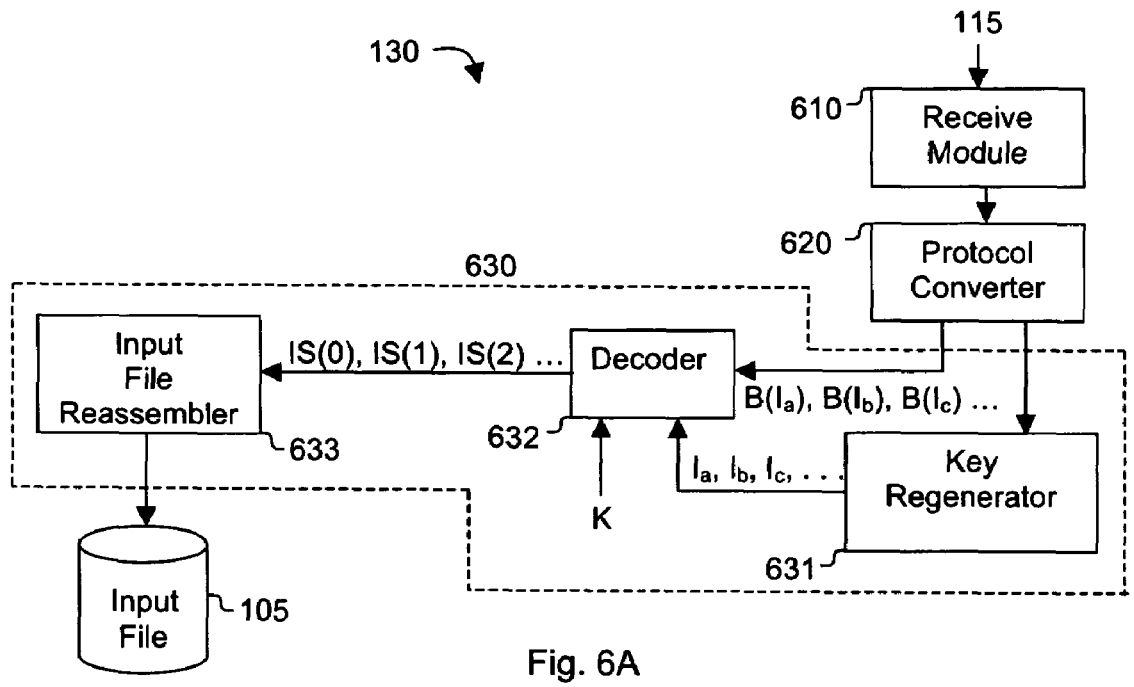
FIG. 6A illustrates a first embodiment of a receiver, as might be used in the system of FIG. 1A, comprising a single-stage information additive code receiver in accordance with the present invention.

FIG. 6A illustrates a first embodiment of the receiver 130, comprising a single-stage information additive code receiver in accordance with the present invention. The term "receiver" is used generically to refer to the unit's function, and may comprise a network client, computer peripheral, a radio, PCMCIA card, cable modem, satellite radio receiver, network device, a GPS-based car navigation receiver, set-top-box, home network gateway, or any such unit which is configured to receive and process the coded information as described herein.

The receiver 130 functions complementarily to the single-stage transmitter of FIG. 2A above and includes a receive module 610, a protocol converter 620, and a single-stage decoder 630. The receive module 610 is operable to receive the coded transmission 115 and recover therefrom the output symbols and, when present, data about the transmitted keys. The receive module 610 comprises that hardware, software, firmware or a combination thereof needed to carry out these functions and may comprise, for example, a signal collection means (e.g., an antenna, optical lens/telescope, cable modem, network interface card, 802.11x radio card, etc.), front-end electronics, and a demodulator to recover the output symbols and key data.

The protocol converter 620 receives the output symbols and key data, and formats each to the protocol appropriate for the particular receiver system. Exemplary receiver protocols include TCP/IP, UDP/IP, MPEG2-TS, or other network or communication system protocols. In alternative embodiments in which the protocol of the recovered output symbols and key data do not require reformatting, the protocol converter 620 is omitted or bypassed.

The single-stage decoder 630 and corresponding method of operation are generally as described in Luby I, the contents of which is incorporated by reference. As shown, a key regenerator 631 receives key data and regenerates the keys for the received output symbols. Symbol decoder 632 uses the keys provided by key regenerator 631 together with the corresponding output symbols, to recover the input symbols (i.e., IS(0), IS(1), IS(2), etc). Symbol decoder 632 provides the recovered input symbols to an input file reassembler 633, which generates a copy of input file or stream 105.

FIG. 6B illustrates a method of recovering input symbols from a coded transmission using the receiver shown in FIG. 6A in accordance with one embodiment of the present invention. At 652, the receiver receives one or more output symbols, each output symbol being generated from one or more input symbols from an order set of input symbols. Preferably, at least one output symbol is generated from a set of at least two, but fewer than all of the input symbols in the ordered set of input symbols. More preferably as described above, the number of possible output symbols is much greater than the number of input symbols in the ordered set. At 654, the ordered set of input symbols is regenerated from a received set of N output symbols. Preferably, N is greater than one, but much smaller than the number of input symbols in the ordered set.

Figure 7A:
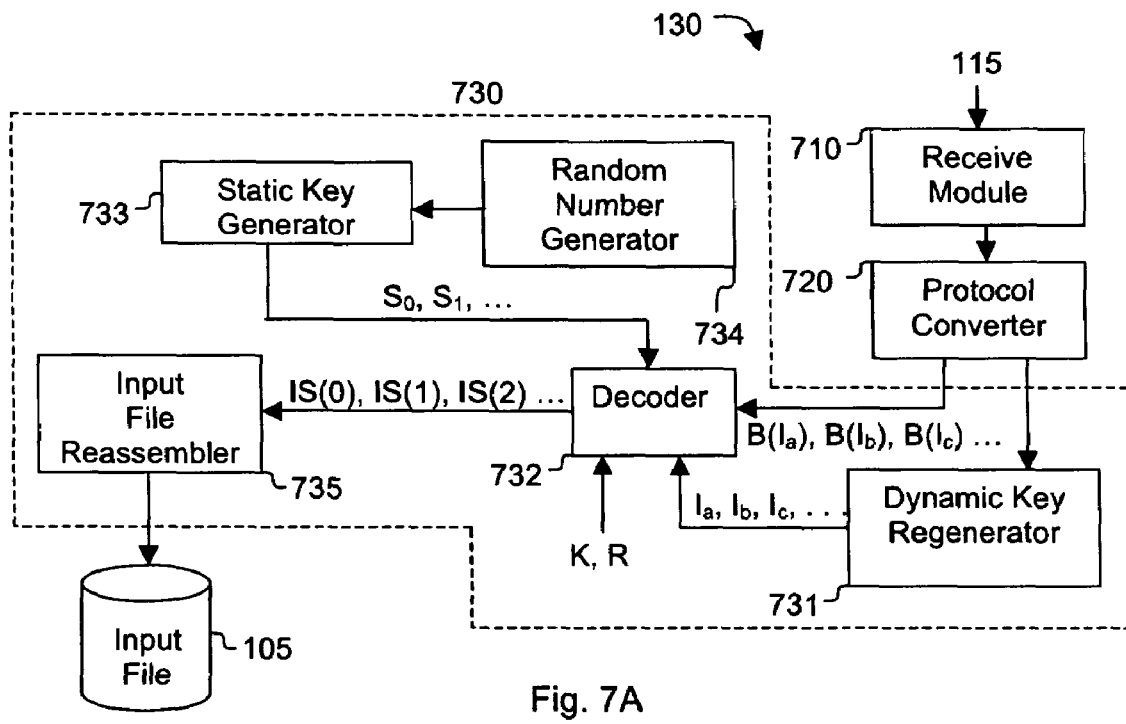
FIG. 7A illustrates a second embodiment of the receiver comprising a multistage information additive code receiver in accordance with the present invention.

FIG. 7A illustrates a second embodiment of the receiver 130 comprising a multistage information additive code receiver in accordance with the present invention. The receiver 130 functions complementarily to the transmitter of FIG. 3A and is constructed similarly to the single stage receiver illustrated in FIG. 4A above. The multistage receiver 130 similarly includes a receive module 710, a protocol converter 720, and a multistage decoder 730. The receive module 710 and protocol converter 720 operate in much the same manner as described above in FIG. 6A. The multistage decoder 730 employs a two-stage coding scheme as described in the Raptor, incorporated herein by reference.

During decoder operation, key data information is provided to the dynamic key regenerator 731, which, in response, regenerates dynamic keys $I_a$, $I_b$, etc. The static key generator 733 produces static keys $S_0$, $S_1$, etc. in response to a seed value supplied to it by the random number generator 734. Output symbols $B(I_0)$, $B(I_1)$, etc., dynamic keys $I_a$, $I_b$, etc., static keys $S_0$, $S_1$, etc., and values K and R are provided to the symbol decoder 732, which, in response, produces input symbols IS(0), IS(1), etc. The input symbols are supplied to a data reassembler 735 which substantially reconstructs a copy of the original data file or stream.

Figure 7B:
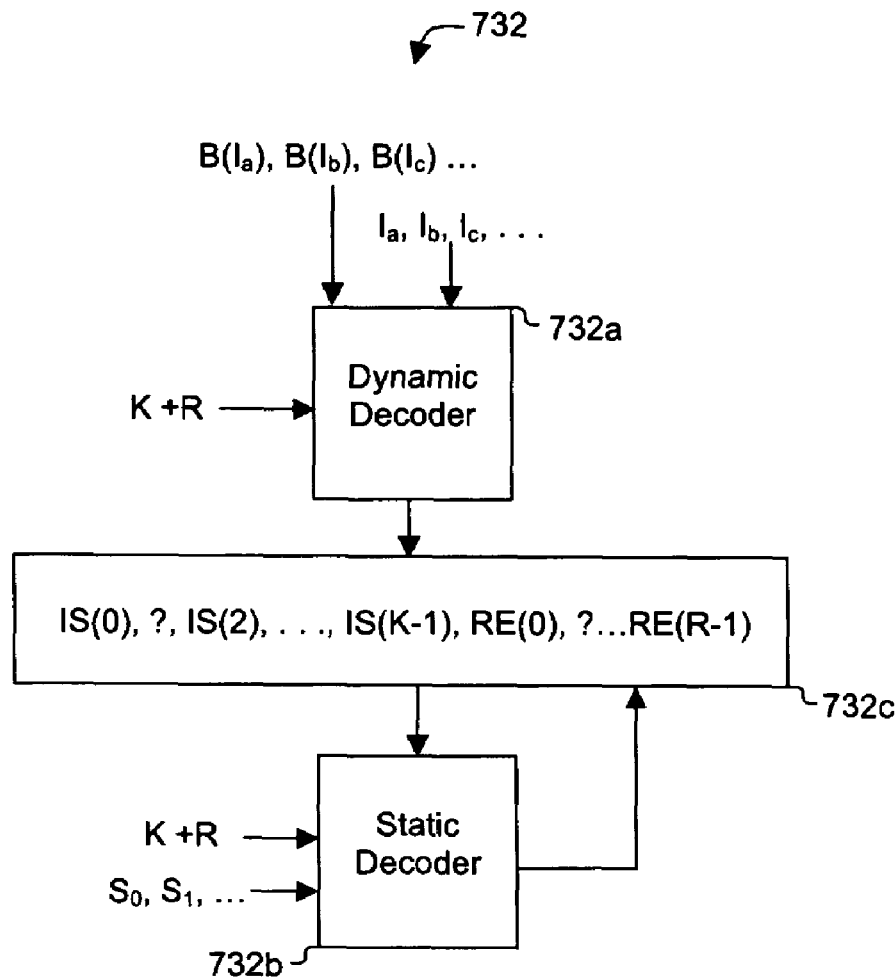
FIG. 7B illustrates one embodiment of the symbol decoder in accordance with the invention.

FIG. 7B illustrates one embodiment of the symbol decoder 732 in accordance with the invention. The symbol decoder 732 includes a dynamic decoder 732a, a static decoder 732b, and a reconstruction buffer 732c. The dynamic decoder 732a receives the output symbols $B(I_a)$, $B(I_b)$, etc. and the dynamic keys $I_a$, $Ib$, etc. In response, the symbol decoder 732 attempts to reconstruct the input symbols IS(0)-IS(K-1) and redundant symbols RE(0)-RE(R-1). Input and redundant symbols recovered by the dynamic decoder 732a are stored in the reconstruction buffer 732c.

Upon completion of dynamic decoding, the static decoder 732b attempts to recover any input symbols not recovered by the dynamic decoder 732a. In particular, the static decoder 732b receives input and redundant symbols from the reconstruction buffer 732c, and static keys $S_0$, $S_1$, etc. from the static key generator. The recovered input symbols stored in the reconstruction buffer 732c are supplied to the input data assembler 735 (of FIG. 7A).

Figure 7C:
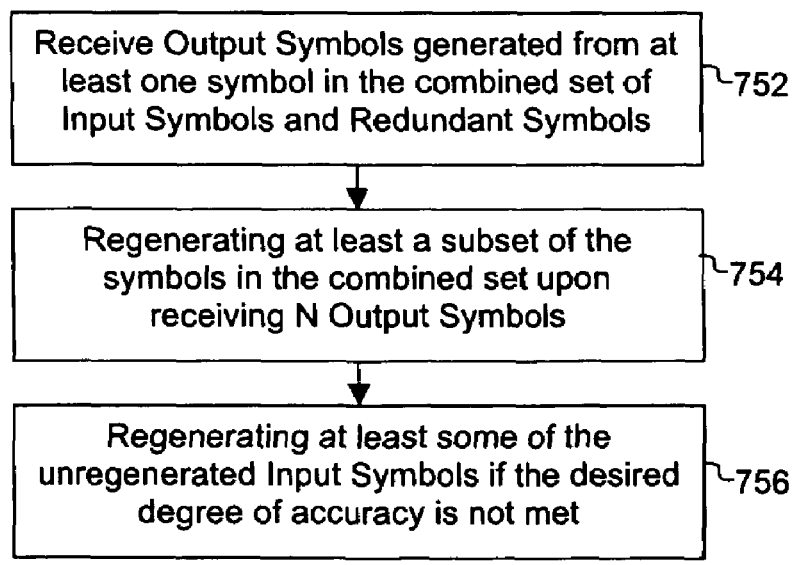
FIG. 7C illustrates a method of recovering input symbols from a coded transmission using the receiver shown in FIG. 7A.

FIG. 7C illustrates a method of recovering input symbols from a coded transmission using the receiver shown in FIG. 7A in accordance with one embodiment of the present invention. At 752, the receiver receives one or more output symbols, each output symbol being generated from one or more symbols from a combined set of input symbols and redundant symbols. Preferably, at least one output symbol is generated from a set of at least two, but fewer than all of the symbols in the combined set of input and redundant symbols. More preferably as described above, the number of possible output symbols is much greater than the number of symbols in the combined set of input and redundant symbols. At 754, at least a subset of the combined set of input and redundant symbols is regenerated from a received set of N output symbols, whereby the combined set includes regenerated input symbols and regenerated redundant symbols. At 756, some of the unregenerated input symbols may be regenerated from regenerated redundant and input symbols if the previous step 754 does not result in the regeneration of the input symbols to a predefined degree of accuracy.

As described above with respect to the broadcast transmitter embodiments, the receive modules, protocol converters, and decoders may be individually realized in a variety of forms, such as in hardware, in software/firmware, or a combination of these components and in varying degrees of integration, depending upon the particular application.

The foregoing are only exemplary of the systems and methods for receiving and decoding information additive coded data. Further embodiments are described in Raptor.

Inactivation Decoding

In one embodiment of the receiver's decoding processing, decoding starts by identifying an "output symbol of degree one." The term "output symbol of degree one" refers to an output symbol associated with only one source (i.e., input) symbol. Similarly, an output symbol associated with two source symbols would be referred to as an output symbol of "degree two." Source symbols are referred to in a similar manner corresponding to the number of output symbols each source symbol is associated with. An output symbol and an input symbol are described as "associated" if the value of the input symbol is used to obtain the value of the output symbol. The mathematical operation which defines this association may be any particular operation, and in one embodiment, the output symbol's value is the XOR of the values of some of the source symbols.

Once the output symbol of degree one is identified, the associated source symbol is recovered and is removed from the decoding process. The process continues by identifying another output symbol of degree one. The process is continued until all the source symbols are recovered, or until there is no output symbol of degree one.

This decoding process may encounter difficulty when no output symbol of degree one is found. In some instances, the decoding process may stop prematurely and the decoder may flag an error. Alternatively, the decoder may use other more elaborate algorithms like Gaussian elimination to complete decoding, if possible. However, the running time of Gaussian elimination may be prohibitively long for applications where fast decoding is desired, especially when the number of unrecovered input symbols at the time when no more output symbols of degree one are found is large. This would lead to a decoding algorithm whose computational overhead is substantially larger than the information additive decoder, and may therefore be undesirable in certain applications.

Figure 8A:
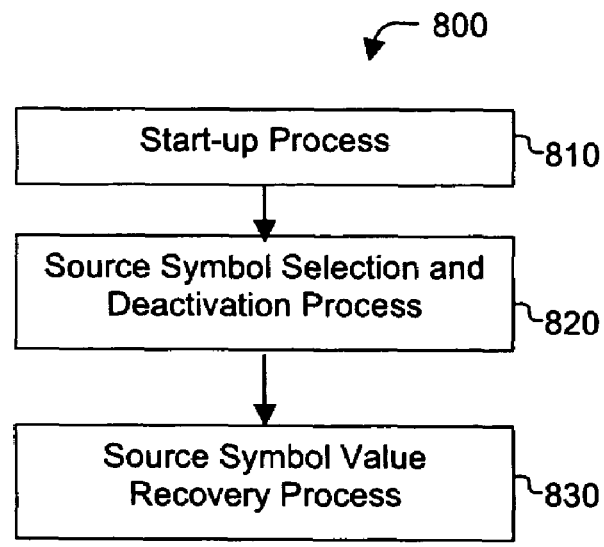
FIG. 8A illustrates a method for decoding the information additive codes using inactivation in accordance with one embodiment of the present invention.

FIG. 8A illustrates a method for decoding the information additive codes using inactivation in accordance with one embodiment of the present invention. The processes included in the exemplary decoding routine 800 include a start-up process 810, a source symbol selection and deactivation process 820, and a source (i.e., input) symbol value recovery process 830. These processes are described in greater detail in Shokrollahi.

Figure 8B:
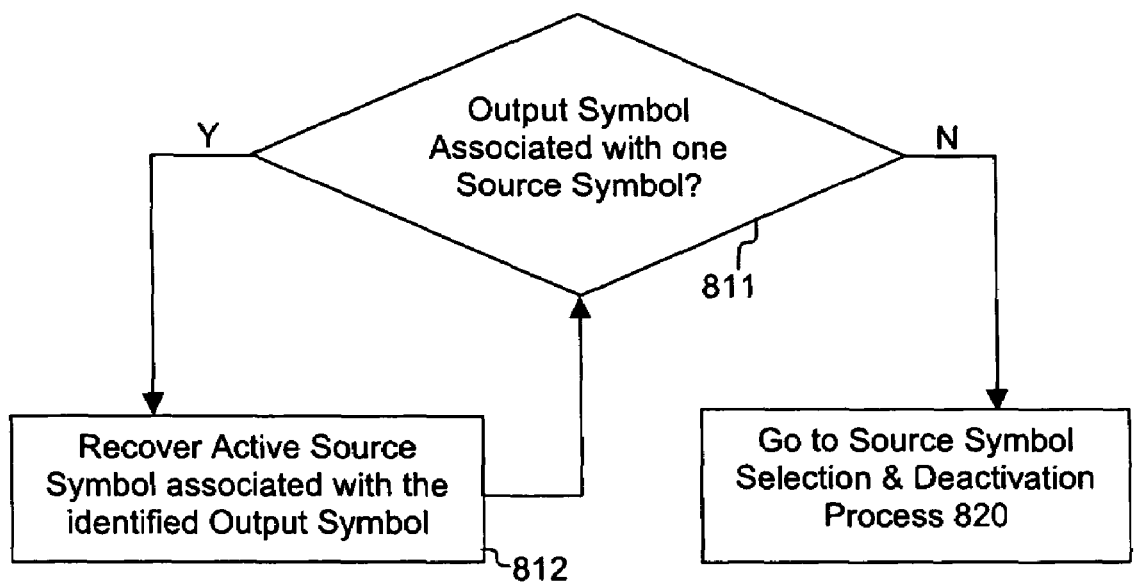
FIG. 8B illustrates one embodiment of the start-up process illustrated in FIG. 8A.

FIG. 8B illustrates one embodiment of the start-up process 810 illustrated in FIG. 8A. Initially at 811, a determination is made whether any output symbols of degree one are present. If so, the source (i.e., input) symbol associated with the output symbol is recovered at 812. The process then returns to 811, where a subsequent determination is made whether any other output symbols of degree one remain in the code. If at 811 no output symbols of degree one remain, the process proceeds to the source symbol selection and deactivation process 820.

Figure 8C:
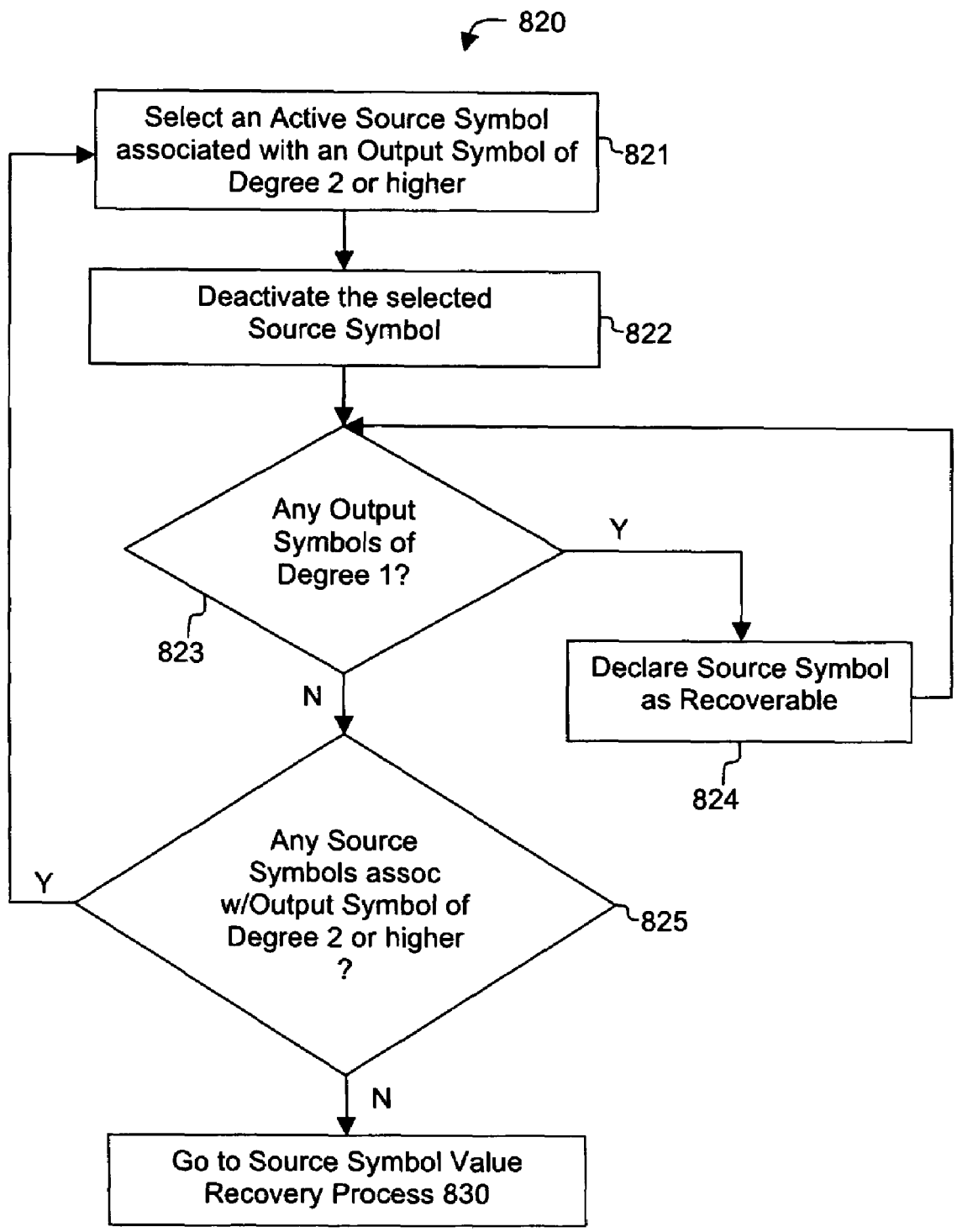
FIG. 8C illustrates a first embodiment of the source symbol selection and deactivation process illustrated in FIG. 8A.

FIG. 8C illustrates one embodiment of the source symbol selection and deactivation process 820 illustrated in FIG. 8A. Initially at 821, an active source symbol is selected which is associated with an output symbol of degree two or higher (i.e., an output symbol associated with two or more source symbols). The manner by which a particular source symbol is selected from among a number of similar source symbols is described in Shokrollahi. Next at 822, the particular source symbol selected is deactivated. Subsequently at 823, a determination is made whether any output symbols of degree one exist for decoding. In some embodiments, the preceding deactivation will produce one or more output symbols of degree one. In other embodiments, the preceding deactivation will not result in an output symbol of degree one. In the latter case, the process repeats the steps of 821-823.

If the deactivation process of 822 does result in the production of one or more output symbols of degree one, the process continues at 824 where one of the source symbols associated with an output symbol of degree one is declared recoverable. The process then returns to 823 where a determination is made whether any additional output symbols of degree one remain. The processes of 823 and 824 are repeated until all of the output symbols of degree one produced by the preceding deactivation process are declared recoverable.

If the deactivation of the selected source symbol at 822 does not result in the an output symbol of degree one, or once all of the output symbols of degree one are declared recoverable at 824, the process continues from 823 to 825, where a determination is made whether any source symbols associated with output symbols of degree two or higher remain. If so, the process returns to 821 where another active source symbol of degree two or higher is selected, deactivated, and the presence of output symbols of degree one is checked. One or more iterations of the processes may occur, for instance, where the deactivation of a first source symbol of degree two or higher does not result in an output symbol of degree one, but additional source symbols of degree two (or higher) remain. In this case, the subsequent deactivation of another source symbol of degree two (or higher) may produce one or more output symbols of degree one. The process repeats until all source symbols have been either been recovered (via the start-up process 810), deactivated (via 822), or declared recoverable (via 825), at which point the process proceeds to the source symbol value recovery process 830.

Figure 8D:
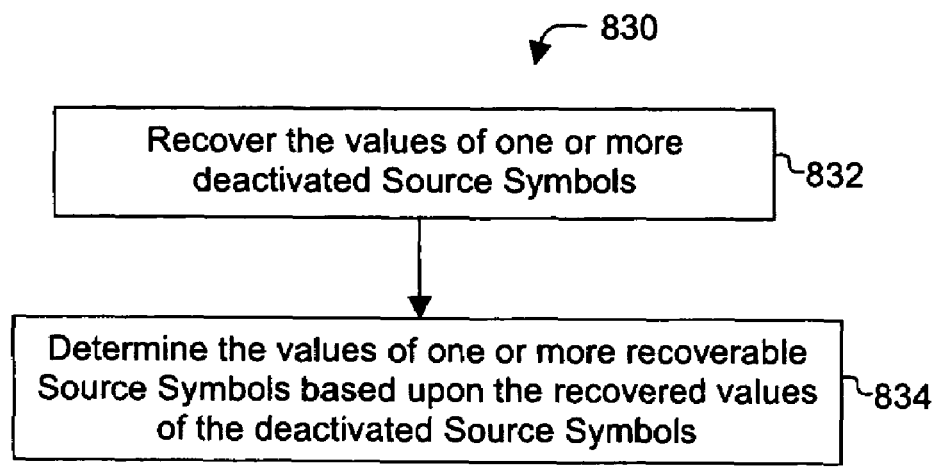
FIG. 8D illustrates one embodiment of the source symbol recovery process illustrated in FIG. 8A.

FIG. 8D illustrates one embodiment of the source symbol recovery process 830 illustrated in FIG. 8A. Initially at 832, the values of one or more source symbols deactivated in 822 are recovered. In a specific embodiment, for instance in which Gaussian elimination is used in the decoding process, all values of deactivated source symbols are recovered in this process. Subsequently at 834, the values of one or more source symbols declared recoverable in process 825 are determined using the recovered values of the deactivated source symbols. In one implementation, such as the aforementioned process in which Gaussian elimination is used, the values of all recoverable source symbols are determined. In alternative embodiments of 832 and 834, the values of one or more, but fewer than all of the recoverable source symbols are determined. This may be advantageous when, for reasons of necessity, expediency, cost, etc., a complete decoding of the information additive code is not required or possible.

The foregoing is only exemplary of the systems and methods for decoding information additive codes through deactivation. Further embodiments are described in Shokrollahi.

Announcement and Previous Program Channels

In a particular embodiment of the invention, receivers are informed about future broadcast transmissions by session description data. Session description data may include a description of the upcoming transmission, the expected day/time of the transmission, and file size of the transmission. The session description data may be communicated on a dedicated announcement channel within the broadcast system (for example, the secondary channel or a channel similar thereto), or it may be multiplexed with the source data along the primary channel.

In another embodiment, source data belonging to a previous data file/stream is broadcast in order to allow those receivers which did not obtain the threshold quantity of coded transmission to recover the previous data file/stream. Coded transmissions corresponding to a previous program may be broadcast on a separate channel (perhaps at a low data rate so as not to too greatly reduce the data rate of the primary and/or announcement channels), or it may be multiplexed with the source and/or announcement data.

Exemplary Applications and Systems

As noted above, the properties of the information additive codes are ideally suited for many broadcast applications, the requirements of which have been only minimally met by present day systems. Conventional broadcast systems which disseminate large data files using a data carousel protocol suffer from protracted transmission periods, as signal transmission must be repeated until a high probability exists that most terminals have received each specific segment of data. When it is considered that the receiving terminal may be intermittently available (e.g., a car which stops receiving when the ignition is switched off, or which looses signal reception within a tunnel), an even longer broadcast period must be undertaken.

Broadcast systems employing information additive coding avoids these shortcomings, as one of the code's properties is that only a threshold quantity of code segments need be decoded in order to recover the entire encoded file. The receiving terminal need only receive a particular threshold amount of data to recover the file, and data received during any reception period will contribute toward that threshold. As a result, broadcast time to these terminals is substantially reduced.

Solution for Broadcasting to Automobiles

Current in-car global positioning satellite (GPS) systems combine satellite positioning information with a DVD-based database. These databases include maps, routing information, and Point-of-Interest (POI) information data, including retail and services information, for example. Updates on routing and POI information must be constantly communicated to drivers if the navigational system is to be relied upon. Further, in-car navigation systems represent a primary platform for receiving large information and entertainment files such as current weather reports, audible books, movies, or information useful for the driver and passengers. Accordingly, in-car navigation systems operable to support these services would provide substantial value.

Figure 9A:
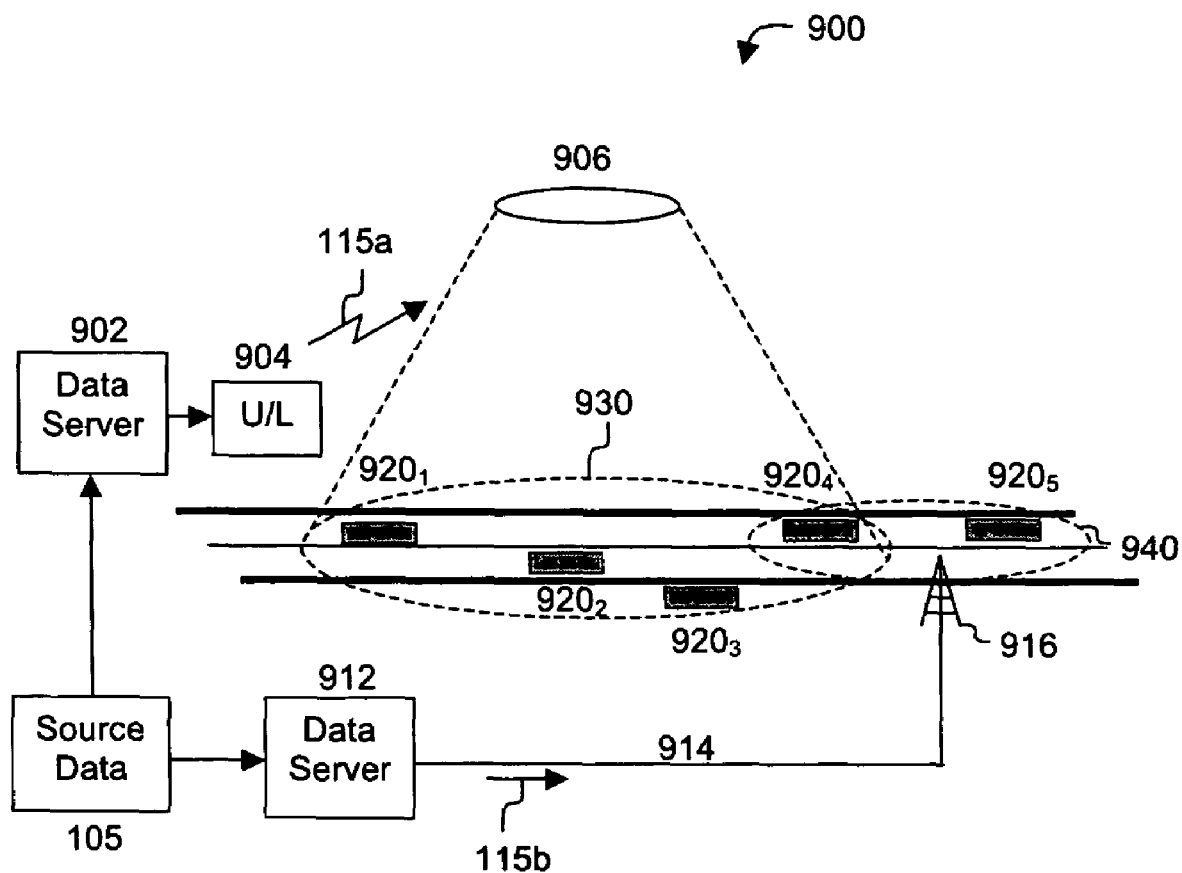
FIG. 9A illustrates one embodiment of the present invention comprising a system for broadcasting data to a large number of mobile terminals.

FIG. 9A illustrates one embodiment of the present invention comprising a satellite system 900 for broadcasting data, such as the aforementioned data and/or entertainment services, to a large number of vehicle-based terminals 920. The system 900 includes two transmitters, 906 being a satellite-based transmitter, and 916 being a terrestrial-based transmitter. Satellite system 900 includes a server 902 which includes the above-described encoder 210/310 (and protocol converter 220/320 if needed), a satellite uplink 904, and a satellite-based transmitter 906 configured to communicate data to vehicles within a first coverage area 930. A terrestrial-based transmitter includes a second server 912 which also includes the aforementioned encoder 210/310 (and protocol converter 220/320 if needed), a transmission line 914, and a broadcast tower 916 operable to provide the coded transmission to vehicles within a second coverage area 940. The complementary use of terrestrial broadcast towers or other communication means may be advantageous to cover gaps or provide coverage in those areas where satellite coverage may be unable to reach. Coverage areas 930 and 940 are shown as overlapping, although gaps may exist between coverage areas in alternative embodiments under the present invention.

Several vehicles 920 are located within the coverage areas 930 and 940. Vehicles $920_1$ and $920_2$ are in motion within coverage area 930 and receive the coded transmission 115a from the satellite-based transmitter 110a at the data rate provided thereby. Vehicle $920_3$ is parked with its ignition switched off, and as a result may not receive the coded transmission 115a. Optionally, Vehicle $920_3$ includes a power supply which continues supplying power to its receiver, thereby permitting it to continue receiving the coded transmission when parked. Vehicle $920_4$ is located in the overlapping regions of 930 and 940. Vehicle $920_5$ is within the second coverage area receiving the coded transmission 115b at its transmission rate.

Each of the transmitters 110 may comprise a single- or multistage encoders as described in FIG. 2A or 3A, respectively. In addition, the pre-encoding data segmenting process described in FIGS. 8A-8C may be employed. Each of the receivers preferably includes a decoder of the same type (i.e., single- or multistage) used in the system's transmitter. Further, the decoder may employ the inactivation process as described above. In a particular embodiment, the receiver is powered by a 12 Vdc supply of other voltage supply provided by the vehicle's battery, and is integrated within the navigation receiver. The receiver may include software executed within a flash-based microprocessor/microcontroller which controls the navigation system to perform the reception, protocol conversion and data decoding functions as described herein.

Solution for Broadcasting to Mobile Handsets

Figure 9B:
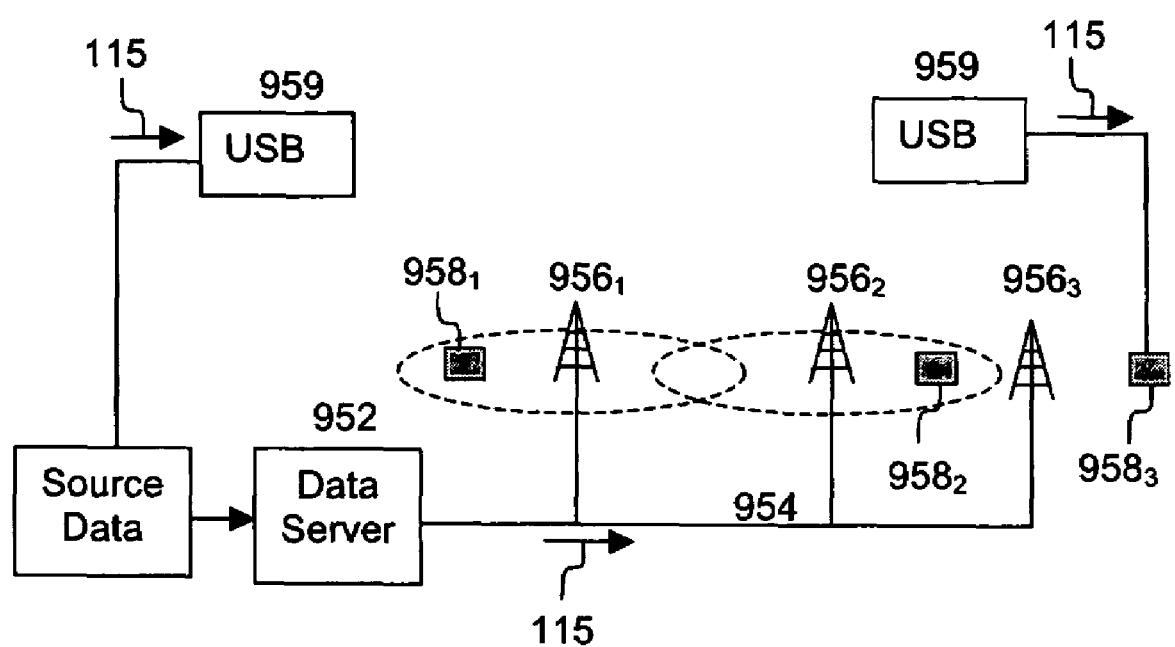
FIG. 9B illustrates another embodiment of the present invention comprising a system for broadcasting live streaming data to a large number of mobile terminals.

FIG. 9B illustrates another embodiment of the present invention comprising a system for broadcasting live streaming data to a large number of mobile handset terminals. Live data may comprise news, financial information such as a stock ticker, a live sporting event, or some such similar content.

The system includes a server 952 comprising an encoder (and protocol converter, if necessary), a communications backbone 954, and communication towers $956_x$ ($956_3$ shown as temporarily inoperable). Mobile terminals $958_x$ may be cellular telephones, computers able to receive the coded transmission 115 wirelessly via 802.11x radio cards, personal digital assistants, or other similar wireless mobile terminals. The system 950 further includes a secondary channel 959, shown as a USB (universal serial bus) connection to which mobile terminal $958_3$ connects to receive the coded transmission 115. As above the encoder may comprise the single- or multistage encoder, and preferably includes the post-encoding data interleaving and partitioning processes described for live streaming applications in FIGS. 7A-7C above. Further, the encoding processes may include the pre-encoding data segmenting process to further decrease transmission delay.

Mobile receivers $958_x$ will preferably employ decoders (single- or multistage) matched to their system's encoder. In some embodiments, the decoding process will include the symbol deactivation processes described in FIGS. 8A-8D. The mobile handset may include software executed within a flash-based microprocessor which controls the handset to perform the reception, protocol conversion and data decoding functions as described herein.

While the aforementioned receivers have been described as mobile, in other embodiments the terminals will be stationary, for instance, where the receiver loses signal reception intermittently due to its location on the boundary of a covered area, or failure or relative movement of the broadcasting source. Further, the systems and methods of the present invention may be used to facilitate communication between any type of transmitter and receiver, not only to those receivers characterized as intermittently available. Those skilled in the art will readily appreciate that the features of the present invention can be equally and advantageously applied to receiving systems which are configured to continuously receive data, as well as to any broadcast system in which highly efficient communication to multiple receivers is desired.

The foregoing description has been presented for purposes of illustration and description. It is not intended to be exhaustive or to limit the invention to the precise form disclosed, and obviously many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A broadcast system, comprising:

one or more information additive code transmitters configured to broadcast output symbols generated from information additive codes to a plurality of information additive code receivers, each information additive code transmitter comprising an encoder configured to receive source data and to produce the output symbols therefrom, wherein the information additive code is such that a number of possible output symbols can be independent of a number of input symbols derived from the source data; and the plurality of information additive code receivers configured to receive the output symbols broadcast by the one or more information additive code transmitters, each information additive code receiver comprising a decoder configured to substantially reconstruct a copy of the source data from the received output symbols; wherein the output symbols transmitted to the plurality of information additive code receivers at any particular time is independent of the output symbols previously received by each of the plurality of information additive code receivers, wherein when an amount of non-redundant output symbols sufficient to reconstruct the source data has been received at each of the plurality of information additive code receivers, the plurality of information additive code receivers reconstruct the source data independent of when, and from which of the one or more information additive code transmitters the output symbols were received.

2. The broadcast system of claim 1, wherein the encoder comprises a single-stage encoder, and wherein the decoder comprises a single-stage decoder.

3. The broadcast system of claim 1, wherein the encoder comprises a multistage encoder, and wherein the decoder comprises a multistage decoder.

4. The broadcast system of claim 1, wherein the information additive code transmitter further comprises a protocol converter coupled to the encoder, and wherein the information additive code receiver comprises a protocol converter coupled to the decoder.

5. The broadcast system of claim 1, wherein at least one of the plurality of information additive code receivers further comprises means for receiving data via a secondary channel.

6. The broadcast system of claim 1, wherein the coded transmission is communicated via a satellite link.

7. The broadcast system of claim 1, wherein the coded transmission is communicated via a terrestrial wireless link.

8. The broadcast system of claim 1, wherein the coded transmission is communicated via an electrical or optical cable.

9. The broadcast system of claim 1, wherein the one or more information additive code transmitters further comprise a transmit module coupled to the encoder, the transmit module operable to modulate the output symbols onto a carrier signal, the carrier signal modulated with the output symbols comprising a coded transmission.

10. The broadcast system of claim 9, wherein the plurality of information additive code receivers further comprise a receive module coupled to the decoder, the receive module operable to demodulate the coded transmission, thereby extracting the output symbols, the receive module supplying the extracted output symbols to the decoder.

11. The broadcast system of claim 1, wherein the encoder further comprises:

a cache unit having an input coupled to receive segments of source data and an output coupled to the encoder, the cache unit configured to store segments of source data and to output segments of source data to the encoder upon receipt of a command; and a control unit coupled to the cache unit and to the encoder, the control unit configured to output the command signal to the cache unit.

12. The broadcast system of claim 11, wherein the cache unit further comprises:

an upload unit having an input coupled to receive segments of source data, a command port coupled to the control unit, and an output; and two or more segment buffers having an input coupled to the upload unit and an output coupled to the encoder.

13. The broadcast system of claim 12, wherein the encoder comprises two or more encoders each having an input coupled to the output of the two or more segment buffers.

14. An information additive code transmitter, comprising:

an encoder configured to receive source data and to produce output symbols generated from the source data using information additive code, wherein the information additive code is such that a number of possible output symbols can be independent of a number of input symbols derived from the source data; and a transmit module coupled to the encoder and configured to broadcast the output symbols to a plurality of information additive code receivers; wherein the output symbols transmitted to the plurality of information additive code receivers at any particular time is independent of the output symbols previously received by each of the plurality of information additive code receivers, wherein when an amount of non-redundant output symbols sufficient to reconstruct the source data has been received, the information additive code receivers reconstruct the source data independent of when, or in what order the output symbols were received.

15. The information additive code transmitter of claim 14, wherein the encoder comprises a single stage encoder, further comprising:

an input symbol generator configured to receive the source data and to provide an ordered sequence of input symbols in response;

a key generator operable to output an encoding key for each input symbol in the ordered sequence; and a symbol encoder coupled to the input symbol generator and the key generator, the symbol encoder operable to receive the ordered sequence of input symbols and the encoding key for each input symbol, and in response produce the output symbols.

16. The information additive code transmitter of claim 14, wherein the encoder comprises a multistage encoder, comprising:

an input symbol generator having an input for receiving the source data and an output for providing an ordered sequence of input symbols in response;

a static key generator configured to provide a sequence of static encoding keys corresponding to the sequence of input symbols;

a dynamic key generator configured to provide a sequence of dynamic encoding keys corresponding to the sequence of input symbols; and a symbol encoder coupled to the input symbol generator, the static key generator, and the dynamic key generator, the symbol encoder comprising:
  a static encoder configured to receive the ordered sequence of input symbols and the corresponding sequence of static encoding keys, the static encoder producing a sequence of redundant symbols in response; and
  a dynamic encoder coupled to the static encoder and configured to receive the sequence of redundant symbols and the sequence of dynamic encoding keys, the dynamic encoder producing a sequence of output symbols in response.

17. The information additive code transmitter of claim 14, wherein the encoder comprises:
  means for receiving a first segment of a live data stream, the first segment $S_0$ containing first segment data;
  means for applying a forward error correction algorithm to the first segment data to produce a corresponding transmit block $T_0$;
  means for dividing the $T_0$ block into two or more $T_0$ subblocks, wherein each of the two or more $T_0$ subblocks comprise substantially distinct FEC-encoded first segment data;
  means for transmitting a first of the two or more $T_0$ subblocks to a receiver on a first main subchannel;
  means for receiving a second segment of the live data stream, the second segment $S_1$ containing second segment data;
  means for applying a forward error correction algorithm to the second segment data to produce a transmit block $T_1$;
  means for dividing the $T_1$ block into two or more $T_1$ subblocks, wherein each of the two or more $T_1$ subblocks comprise substantially distinct FEC-encoded second segment data;
  means for transmitting substantially concurrently, the second of the two or more $T_0$ subblocks on the first main subchannel and a first of the two or more $T_1$ subblocks on a second main subchannel; and
  means for transmitting substantially concurrently, the first $T_0$ subblock on a first booster subchannel, and the first $T_1$ subblock on a second booster subchannel, wherein the second $T_0$ subblock, the first $T_1$ subblock, the first $T_0$ subblock, and the first $T_1$ subblock are all transmitted substantially concurrently, wherein the $T_0$, $T_1$, and $T_2$ subblocks comprise the output symbols.

18. The information additive code transmitter of claim 14, wherein the encoder comprises:
  a cache unit having an input coupled to receive segments of source data and an output coupled to the encoder, the cache unit configured to store segments of source data and to output segments of source data to the encoder upon receipt of a command; and
  a control unit coupled to the cache unit and to the encoder, the control unit configured to output the command signal to the cache unit.

19. The information additive code transmitter of claim 18, wherein the cache unit further comprises:
  an upload unit having an input coupled to receive segments of source data, a command port coupled to the control unit, and an output; and
  two or more segment buffers having an input coupled to the upload unit and an output coupled to the encoder.

20. The information additive code transmitter of claim 19, wherein the encoder comprises a respective two or more encoders each having an input coupled to the output of the two or more segment buffers.

21. The information additive code transmitter of claim 14, further comprising a protocol converter coupled to the encoder and configured to convert the output symbols from a first protocol to a second protocol.

22. The information additive code transmitter of claim 21, wherein the first protocol is an IP protocol and the second protocol is a satellite broadcasting system protocol.

23. The information additive code transmitter of claim 21, wherein the first protocol is an IP protocol and the second protocol is a terrestrial broadcasting system protocol.

24. The information additive code transmitter of claim 14, further comprising a transmit module coupled to the encoder, the transmit module operable to modulate the output symbols onto a carrier signal, the carrier signal modulated with the output symbols comprising a coded transmission.

25. The information additive code transmitter of claim 24, wherein the carrier signal comprises a satellite uplink, cross-link, or down link signal.

26. The information additive code transmitter of claim 24, wherein the carrier signal comprises a terrestrial broadcast signal.

27. An information additive code receiver, comprising:
  a receive module configured to receive output symbols generated from information additive code, wherein the output symbols are broadcast from one or more information additive code transmitters, wherein the information additive code is such that a number of possible output symbols can be independent of a number of input symbols derived from the source data, wherein the output symbols received from the one or more information additive code transmitters at any particular time is independent of the output symbols previously received; and
  a decoder coupled to the receive module and configured to decode the received output symbols into source data, wherein when an amount of non-redundant output symbols sufficient to reconstruct the source data has been received, the receiver module reconstructs the source data independent of when, or from which of the one or more information additive code transmitters the output symbols were received.

28. The information additive code receiver of claim 27, wherein the decoder comprises a single stage decoder, further comprising:
  a key regenerator coupled to the receive module, the key regenerator configured to receive the output symbols, and to produce respective decoding keys in response;
  a symbol decoder coupled to the receive module and to the key regenerator, the key regenerator operable to receive the output symbols and the decoding keys, and in response produce the input symbols; and
  an input file reassembler coupled to the symbol decoder and configured to receive and reassemble the input symbols into source data.

29. The information additive code receiver of claim 27, wherein the decoder comprises a multistage decoder, further comprising:
  a dynamic key regenerator coupled to the receive module, and configured to receive the output symbols and to produce respective dynamic keys in response;
  a symbol decoder, further comprising:

a) a dynamic decoder coupled to the dynamic key regenerator and the received module, the dynamic decoder configured to receive the output symbols and the dynamic keys, and to produce a first set of input symbols and redundant symbols in response; and b) a static decoder coupled to the dynamic decoder and configured to receive the redundant symbols, the first set of input symbols, and static keys, the static decoder producing a second set of input symbols in response; and c) an input file reassembler coupled to the symbol decoder and configured to receive and reassemble the first and second set of input symbols into source data.

30. The information additive code receiver of claim 27, wherein each of the plurality of output symbols is associated with one or more input symbols, wherein an output symbol associated with one symbol comprises an output symbol of degree, wherein an output symbol associated with two or more source symbols comprises an output symbol of degree two or more, and wherein at least one source symbol is marked as active, the information additive code receiver, further comprising:

means for selecting one of the active source symbols that is associated with an output symbol of degree two or higher; and means for deactivating the selected source symbol that is associated with the output symbol of degree two or higher.

31. The information additive receiver of claim 30, further comprising:

means for identifying at least one output symbol which is associated with only one active source symbol;

means for recovering the active source symbol associated with the identified output symbol; and means for determining that no output symbol remains which is associated with only one active source symbol.

32. The information additive code receiver of claim 27, further comprising a protocol converter having an input coupled to the receive module and an output coupled to the decoder, the protocol converter configured to convert the received output symbols from a first protocol to a second protocol.

33. The information additive code receiver of claim 32, wherein the first protocol is a satellite broadcasting system protocol and the second protocol is an IP protocol.

34. The information additive code receiver of claim 32, wherein the first protocol is a terrestrial broadcasting system protocol and the second protocol is an IP protocol.

35. The information additive code receiver of claim 27, wherein the received output symbols are modulated onto a carrier signal prior to transmission, the output symbol modulated carrier signal comprising a coded transmission, the receive module further comprising a demodulator operable to demodulate the coded transmission, thereby extracting the output symbols, the receive module supplying the extracted output symbols to the decoder.

36. The information additive code transmitter of claim 35, wherein the carrier signal comprises a satellite uplink, cross-link, or down link signal.

37. The information additive code transmitter of claim 35, wherein the carrier signal comprises a terrestrial broadcast signal.

38. A method for communicating output symbols from one or more transmitters to one or more receivers, the method comprising:

encoding source data into a plurality of output symbols using information additive code, wherein the information additive code is such that a number of possible output symbols can be independent of a number of input symbols derived from the source data;

transmitting the output symbols to a plurality of information additive code receivers from one or more sources;

receiving output symbols from the one or more sources, wherein the output symbols received from the one or more sources at any particular time is independent of which output symbols were previously received, wherein when an amount of non-redundant output symbols sufficient to reconstruct the source data has been received, the one or more information additive code receivers reconstruct the source data independent of when, or in what order the output symbols were received; and decoding the output symbols substantially into a copy of the source data.

39. The method of claim 38, wherein encoding source data to output symbols comprises:

arranging the source data into an ordered sequence of input symbols; and generating, from the ordered sequence of input symbols, a respective sequence of output symbols.

40. The method of claim 38, wherein decoding the output symbols comprises:

generating a plurality of decoding keys corresponding to the received plurality of output symbols; and generating substantially, from the output symbols and the decoding keys, a copy of the source data.

41. The method of claim 38, wherein transmitting comprises transmitting the output symbols via a satellite up link, cross-link, down link or by a terrestrial link.

42. The method of claim 38, wherein receiving comprises receiving the output symbols via a satellite up link, cross-link, down link or by a terrestrial link.

43. The method of claim 38, further comprising converting, prior to transmission, the protocol of the output symbols to a broadcast protocol.

44. The method of claim 38, further comprising converting, prior to decoding, the protocol of the received output symbols.

45. A method for broadcasting output symbols generated from information additive code, comprising:

encoding source data into a plurality of output symbols using information additive code, wherein the information additive code is such that a number of possible output symbols can be independent of a number of input symbols derived from the source data, wherein the output symbols transmitted any particular time is independent of the output symbols previously transmitted; and transmitting the output symbols to one or more a plurality of information additive code receivers, wherein when an amount of non-redundant output symbols sufficient to reconstruct the source data has been received, the plurality of information additive code receivers reconstruct the source data independent of when, or in what order the output symbols were received.

46. The method of claim 45, wherein encoding source data comprises:

arranging the source data into an ordered sequence of input symbols; and generating, from the ordered sequence of input symbols, a respective sequence of output symbols.

47. The method of claim 46, wherein generating a respective sequence of output symbols comprises:
   generating a sequence of encoding keys corresponding to the sequence of input symbols; and
   generating, from the respective sequences of the input symbols and the encoding keys, the respective sequence of output symbols.

48. The method of claim 46, wherein generating a respective sequence of output symbols comprises:
   generating a sequence of static encoding keys corresponding to the sequence of input symbols;
   generating a sequence of dynamic encoding keys corresponding to the sequence of input symbols;
   generating, from respective sequences of the input symbols and the static encoding keys, a respective sequence of redundant symbols; and
   generating, from respective sequences of the input symbols, dynamic encoding keys, and redundant symbols, a respective sequence of output symbols.

49. A method for receiving broadcast output symbols, comprising:
   receiving a plurality of output symbols broadcast from one or more of a plurality of sources, the plurality of output symbols generated from information additive code, wherein the information additive code is such that a number of possible output symbols can be independent of a number of input symbols derived from the source data wherein the plurality of output symbols received at any particular time is independent of which of the plurality of output symbols was previously received; and
   wherein when an amount of non-redundant output symbols sufficient to decode the source data has been received, decoding the plurality of output symbols into source data, wherein the decoding is performed independent of when, or from which of the one or more information additive code sources the plurality of output symbols were received.

50. The method of claim 49, wherein the plurality of output symbols comprises a sequence of output symbols, and wherein decoding the output symbols comprises:
   generating, from the sequence of output symbols, a respective sequence of decoding keys;
   generating from the sequence of output symbols and the respective sequence of decoding keys, a respective sequence of input symbols; and
   reassembling the respective sequence of input symbols into the source data.

51. The method of claim 49, wherein the plurality of output symbols comprises a sequence of output symbols, and wherein decoding the output symbols comprises:
   generating, from the sequence of output symbols, a respective sequence of dynamic decoding keys;
   generating a respective sequence of static decoding keys;
   generating, from the respective sequences of output symbols, the dynamic decoding keys, and the static encoding keys, a respective sequence of input symbols; and
   reassembling the respective sequence of input symbols into the source data.

52. A method of generating a coded transmission comprising output symbols modulated onto a carrier signal and broadcast to a plurality of receivers, the method comprising:
   encoding source data into output symbols using information additive code, wherein the information additive code is such that a number of possible output symbols can be independent of a number of input symbols derived from the source data; and
   modulating the output symbols onto a carrier signal, the modulated carrier signal comprising the coded transmission, wherein the output symbols modulated onto the carrier signal at any particular time are independent of which of the output symbols were previously received by the plurality of receivers, wherein when an amount of non-redundant output symbols sufficient to reconstruct the source data have been received, the receivers reconstruct the source data independent of when, or which of the output symbols, or in what order the output symbols were received.

53. The method of claim 52, wherein the process of encoding the source data into output symbols comprises:
   arranging the source data into an ordered sequence of input symbols; and
   generating, from the ordered sequence of input symbols, a respective sequence of output symbols.

54. The method of claim 53, wherein generating a respective sequence of output symbols comprises:
   generating a sequence of encoding keys corresponding to the sequence of input symbols; and
   generating, from the respective sequences of the input symbols and the encoding keys, the sequence of output symbols.

55. The method of claim 53, wherein generating a respective sequence of output symbols comprises:
   generating a sequence of static encoding keys corresponding to the sequence of input symbols;
   generating a sequence of dynamic encoding keys corresponding to the sequence of input symbols;
   generating, from respective sequences of the input symbols and the static encoding keys, a respective sequence of redundant symbols; and
   generating, from respective sequences of the input symbols, dynamic encoding keys, and redundant symbols, the sequence of output symbols.

56. A computer program product, on a computer readable storage medium, for broadcasting output symbols, the computer program product comprising:
   instruction code to encode source data into output symbols using information additive code, wherein the information additive code is such that a number of possible output symbols can be independent of a number of input symbols derived from the source data; and
   instruction code to transmit the output symbols to a plurality of information additive code receivers, wherein the output symbols when transmitted to the plurality of information additive code receivers is independent of which output symbols were previously received by the plurality of information additive code receivers, wherein when an amount of non-redundant output symbols sufficient to reconstruct the source data have been received, the plurality of information additive code receivers reconstruct the source data independent of when, or which non-redundant output symbols, or in what order the output symbols were received.

57. The computer program product of claim 56, wherein the instruction code to encode the source data into output symbols comprises:
   instruction code to arrange the source data into an ordered sequence of input symbols; and
   instruction code to generate a respective sequence of output symbols from the ordered set of input symbols.

58. The computer program product of claim 57, wherein the instruction code to generate a respective sequence of output symbols comprises:
  instruction code to generate a sequence of encoding keys corresponding to the sequence of input symbols; and
  instruction code to generate, from the respective sequences of the input symbols and the encoding keys, the sequence of output symbols.

59. The computer program product of claim 57, wherein the instruction code to generate a respective sequence of output symbols comprises:
  instruction code to generate a sequence of static encoding keys corresponding to the sequence of input symbols;
  instruction code to generate a sequence of dynamic encoding keys corresponding to the sequence of input symbols;
  instruction code to generate, from respective sequences of the input symbols and the static encoding keys, a respective sequence of redundant symbols; and
  instruction code to generate, from respective sequences of the input symbols, dynamic encoding keys, and redundant symbols, the sequence of output symbols.

60. A computer program product, on a computer readable storage medium, for receiving broadcast output symbols, the computer program product comprising:
  instruction code to receive a plurality of output symbols generated from source data using the information additive code, wherein the information additive code is such that a number of possible output symbols can be independent of a number of input symbols derived from the source data, the output symbols broadcast from one or more sources; and
  instruction code to decode the received output symbols into source data, wherein the output symbols, when received, are independent of which output symbols were previously received, wherein when an amount of non-redundant output symbols sufficient to decode the source data have been received, the instruction code to decode the received output symbols decodes the output symbols independent of when, which of the output symbols, and in what order the output symbols were received.

61. The computer program product of claim 60, wherein the received output symbols comprise a sequence of output symbols, and wherein the instruction code to decode the output symbols comprises:
  instruction code to generate, from the sequence of received output symbols, a respective sequence of decoding keys;
  instruction code to generate from the sequence of received output symbols and the respective sequence of decoding keys, a respective sequence of input symbols; and
  instruction code to reassemble the sequence of input symbols into the source data.

62. The computer program product of claim 60, wherein the received output symbols comprise a sequence of output symbols, and wherein the instruction code to decode the output symbols comprises:
  instruction code to generate, from the sequence of received output symbols, a respective sequence of dynamic decoding keys;
  instruction code to generate a respective sequence of static decoding keys;
  instruction code to generate, from the respective sequences of received output symbols, the dynamic decoding keys, and the static encoding keys, a respective sequence of input symbols; and
  instruction code to reassemble the sequence of input symbols into the source data.

* * * * *